United States Patent
Hou et al.

(10) Patent No.: US 12,424,449 B2
(45) Date of Patent: *Sep. 23, 2025

(54) CMP SYSTEM AND METHOD OF USE

(71) Applicant: Taiwan Semiconductor Manufacturing Co., Ltd., Hsinchu (TW)

(72) Inventors: Te-Chien Hou, Kaohsiung (TW); Yu-Ting Yen, Kaohsiung (TW); Cheng-Yu Kuo, Zhudong Township (TW); Chih Hung Chen, Hsinchu (TW); William Weilun Hong, Hsinchu (TW); Kei-Wei Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/631,589

(22) Filed: Apr. 10, 2024

(65) Prior Publication Data
US 2024/0274440 A1    Aug. 15, 2024

Related U.S. Application Data

(60) Continuation of application No. 17/372,705, filed on Jul. 12, 2021, now Pat. No. 11,984,323, which is a
(Continued)

(51) Int. Cl.
*H01L 21/3105* (2006.01)
*B24B 37/04* (2012.01)
(Continued)

(52) U.S. Cl.
CPC ...... *H01L 21/31053* (2013.01); *B24B 37/042* (2013.01); *B24B 37/044* (2013.01);
(Continued)

(58) Field of Classification Search
CPC .................................................. B24B 53/017
See application file for complete search history.

(56) References Cited

U.S. PATENT DOCUMENTS 11,069,533 B2 *   7/2021  Hou ................ H01L 21/67046
2003/0216045 A1  11/2003  Wang et al.
(Continued)

FOREIGN PATENT DOCUMENTS

KR         100397111 B1       9/2003

OTHER PUBLICATIONS

KR-100397111-B1, Machine Translation. (Year: 2023).

*Primary Examiner* — Parviz Hassanzadeh
*Assistant Examiner* — Margaret Klunk
(74) *Attorney, Agent, or Firm* — Slater Matsil, LLP

(57) ABSTRACT

A chemical mechanical planarization (CMP) system including a capacitive deionization module (CDM) for removing ions from a solution and a method for using the same are disclosed. In an embodiment, an apparatus includes a planarization unit for planarizing a wafer; a cleaning unit for cleaning the wafer; a wafer transportation unit for transporting the wafer between the planarization unit and the cleaning unit; and a capacitive deionization module for removing ions from a solution used in at least one of the planarization unit or the cleaning unit.

20 Claims, 31 Drawing Sheets

Related U.S. Application Data division of application No. 16/515,938, filed on Jul. 18, 2019, now Pat. No. 11,069,533.

(51) Int. Cl.

| | | |
|---|---|---|
| *B24B 37/20* | (2012.01) | |
| *H01L 21/02* | (2006.01) | |
| *H01L 21/67* | (2006.01) | |
| *H10D 64/01* | (2025.01) | |
| *B24B 7/04* | (2006.01) | |
| *B24B 29/00* | (2006.01) | |
| *C02F 1/469* | (2023.01) | |

(52) U.S. Cl.
CPC ........ *B24B 37/20* (2013.01); *H01L 21/02065* (2013.01); *H01L 21/31055* (2013.01); *H01L 21/67046* (2013.01); *H01L 21/67092* (2013.01); *H10D 64/017* (2025.01); *B24B 7/04* (2013.01); *B24B 29/00* (2013.01); *C02F 1/4691* (2013.01)

(56) References Cited

U.S. PATENT DOCUMENTS

| | | |
|---|---|---|
| 2006/0234508 A1 | 10/2006 | Shirakashi et al. |
| 2009/0320875 A1 | 12/2009 | Martinez et al. |
| 2011/0147212 A1 | 6/2011 | Kim et al. |
| 2012/0111361 A1 | 5/2012 | Treichel et al. |
| 2014/0034501 A1* | 2/2014 | Van Der Wal .......... C02F 1/008 |
| | | 204/555 |
| 2014/0216504 A1 | 8/2014 | Xia et al. |
| 2016/0167984 A1* | 6/2016 | Gao ...................... C02F 1/4691 |
| | | 204/660 |

* cited by examiner

CMP SYSTEM AND METHOD OF USE

PRIORITY CLAIM AND CROSS-REFERENCE

This application is a continuation of U.S. application Ser. No. 17/372,705, filed Jul. 12, 2021, which is a divisional application of U.S. application Ser. No. 16/515,938, filed on Jul. 18, 2019 (now U.S. Pat. No. 11,069,533, issuing Jul. 20, 2021), which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
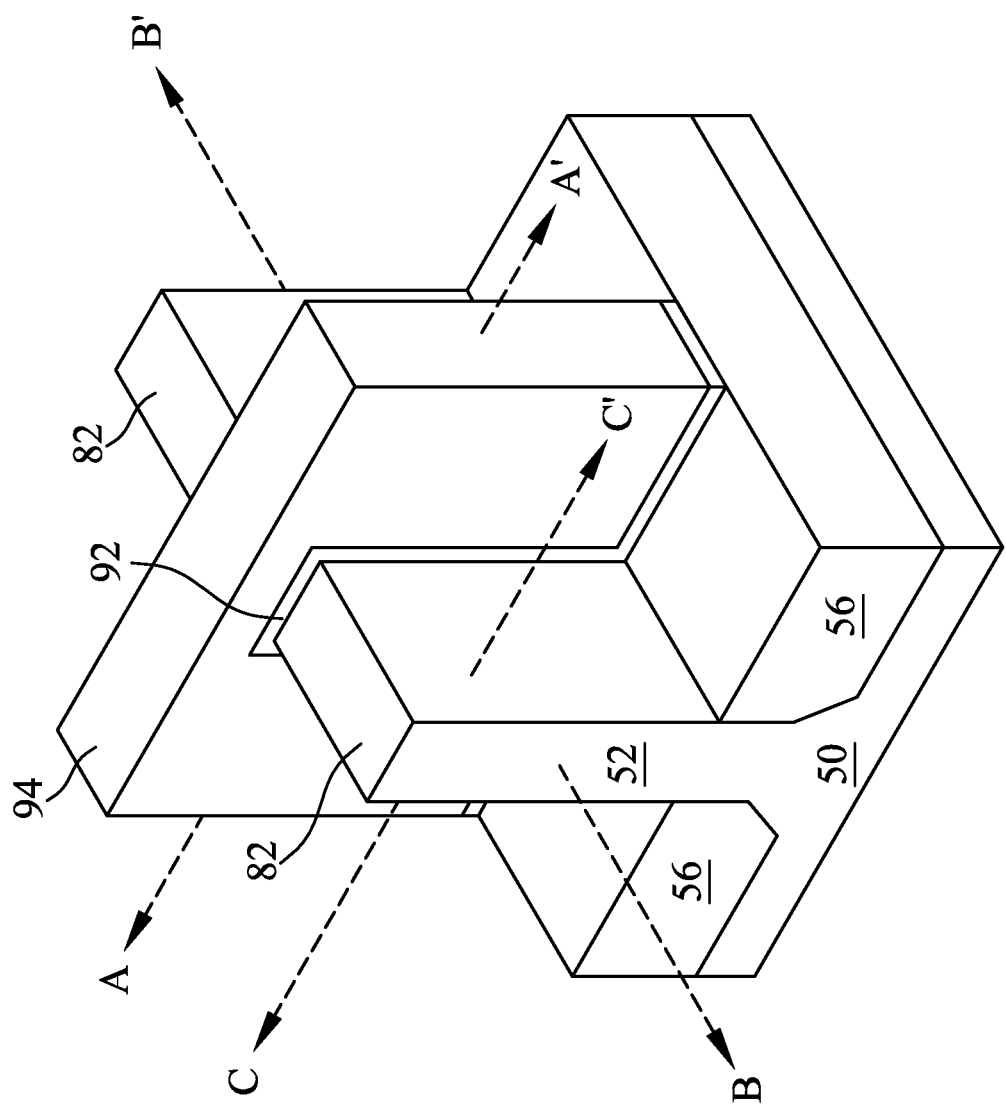
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes and a chemical mechanical planarization (CMP) system used in an improved CMP process. The CMP system may include capacitive deionization modules (CDMs) which are configured to remove ions from solutions used during the CMP processes, including CMP slurries, cleaning solutions, and drying solutions. The CDM modules may be disposed in a main polishing platen, a buffing platen, a tank cleaning module, a chemical mechanical cleaning module, a brush cleaning module, and/or a vapor dryer module in the CMP system. The CDMs may operate in a constant voltage mode or a constant current mode and may be configured as flow-by CDMs or flow-through CDMs. By using the improved CMP process wherein ions are removed from the solutions used in the CMP system, semiconductor devices having improved device performance and improved device yield may be produced. Although the CDMs have been described as being used in the context of a CMP system and process, the CDMs may be used to remove undesirable ions from surfaces of substrates in any processes or systems.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 and the substrate 50 are illustrated as a single, continuous material, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A' is along a longitudinal axis of the gate electrode 94 and in a direction, for example, perpendicular to the direction of current flow between the source/drain regions 82 of the FinFET. Cross-section B-B' is perpendicular to cross-section A-A' and is along a longitudinal axis of the fin 52 and in a direction of, for example, a current flow between the source/drain regions 82 of the FinFET. Cross-section C-C' is parallel to cross-section A-A' and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 9 and 20 through 29B are cross-sectional views of intermediate stages in the manufacturing of FinFETs, in accordance with some embodiments. FIGS. 2 through 9 and 20 illustrate reference cross-section A-A' illustrated in FIG. 1, except for multiple fins/FinFETs. FIGS. 21A, 22A, 23A, 24A, 25A, 26A, 27A, 28A, and 29A are illustrated along reference cross-section A-A illustrated in FIG. 1, and FIGS. 21B, 22B, 23B, 24B, 25B, 26B, 27B, 27C, 28B, and 29B are illustrated along reference cross-section B-B illustrated in FIG. 1, except for multiple fins/FinFETs. FIGS. 23C and 23D are illustrated along reference cross-section C-C' illustrated in FIG. 1, except for multiple fins/FinFETs.

Figure 2:
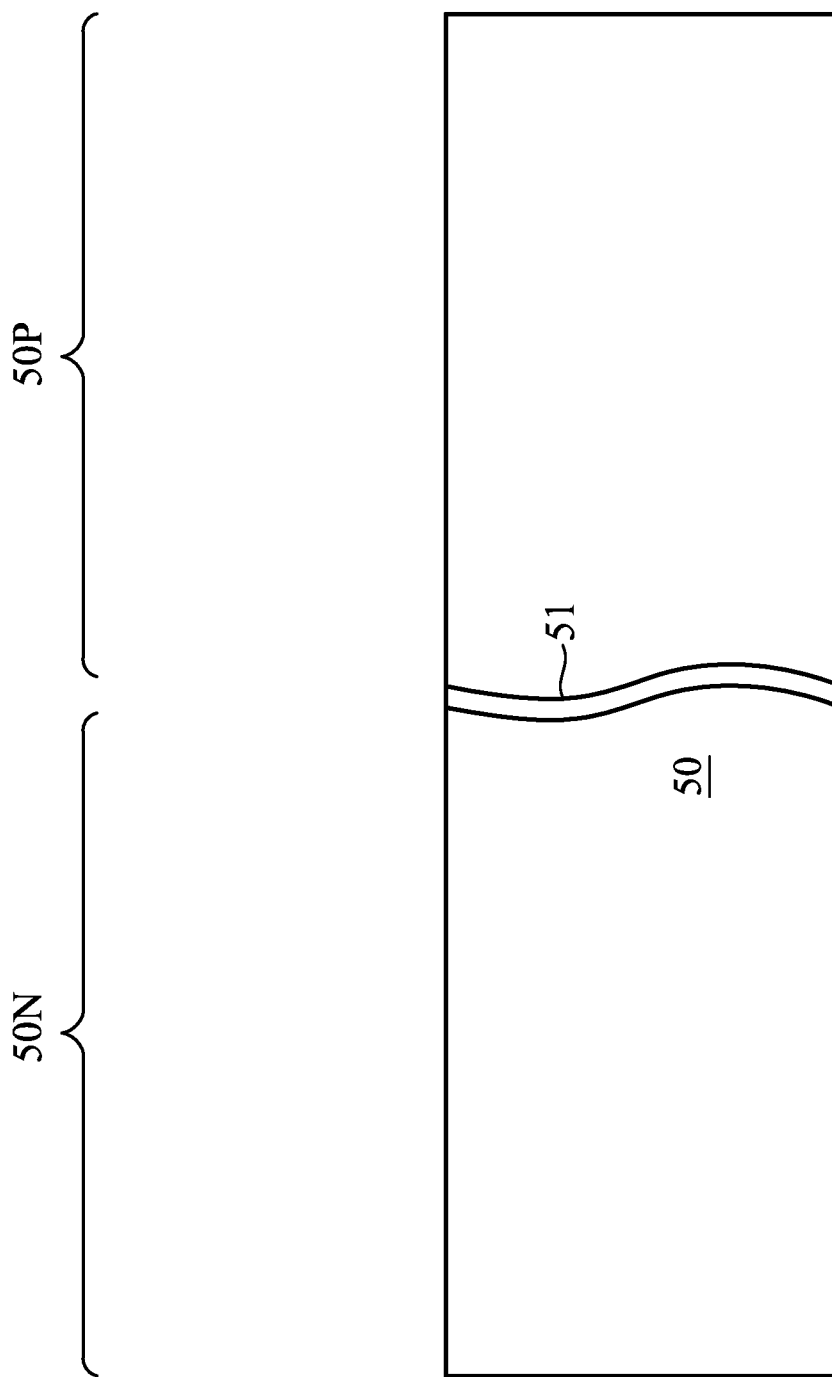
FIGS. 2, 3, 4, 5, 6, 7, 8, and 9 illustrate cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
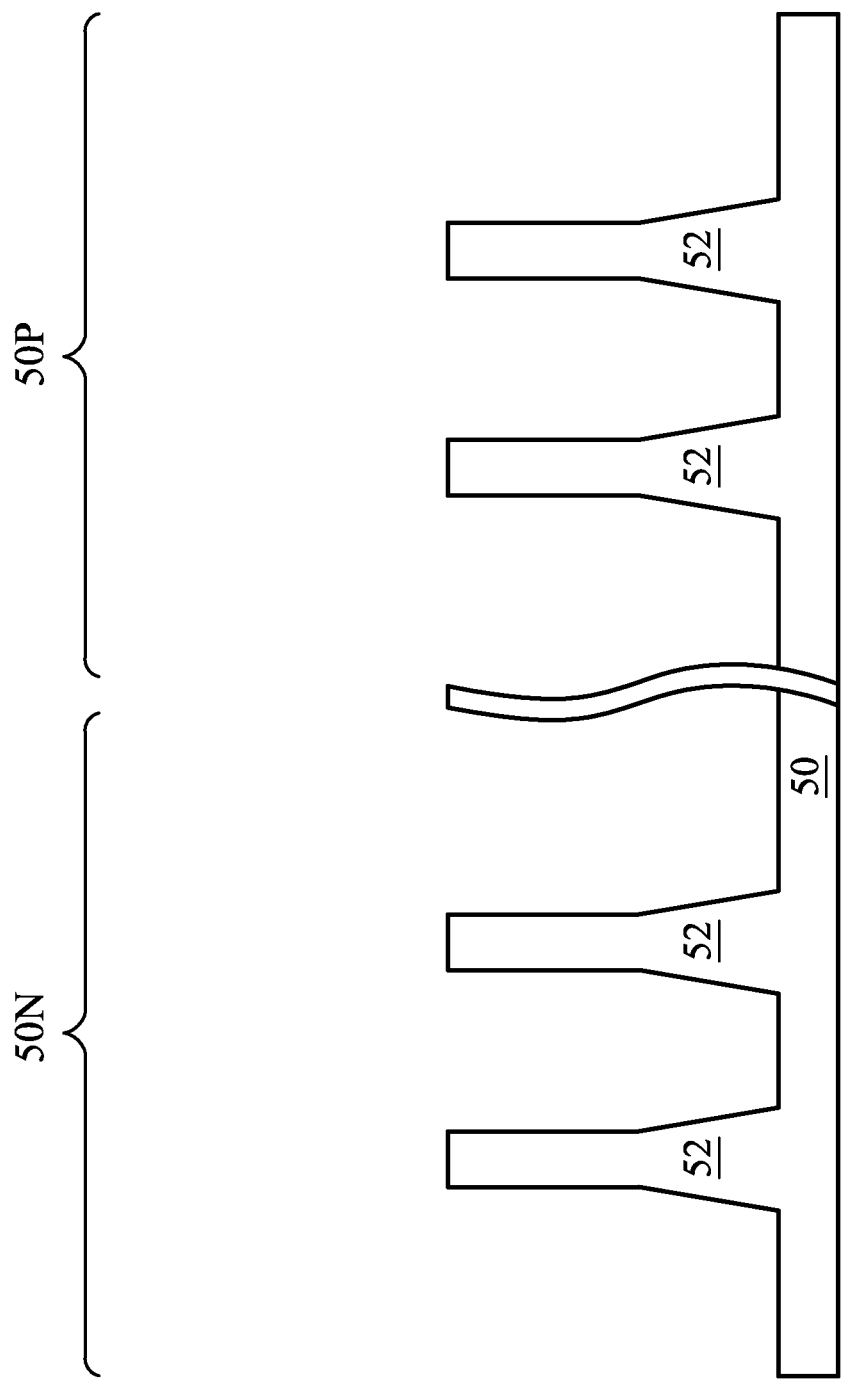

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etching may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
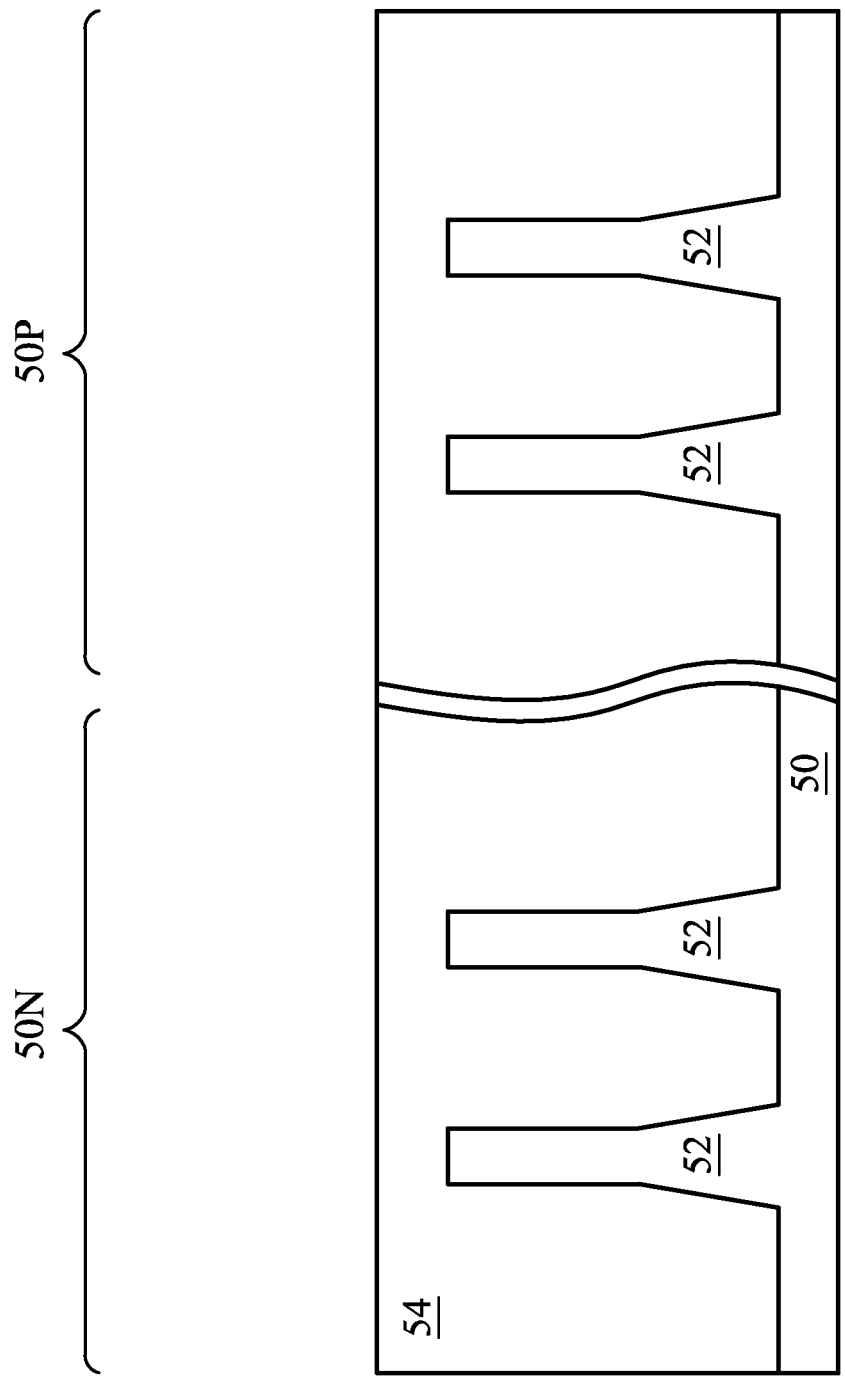

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
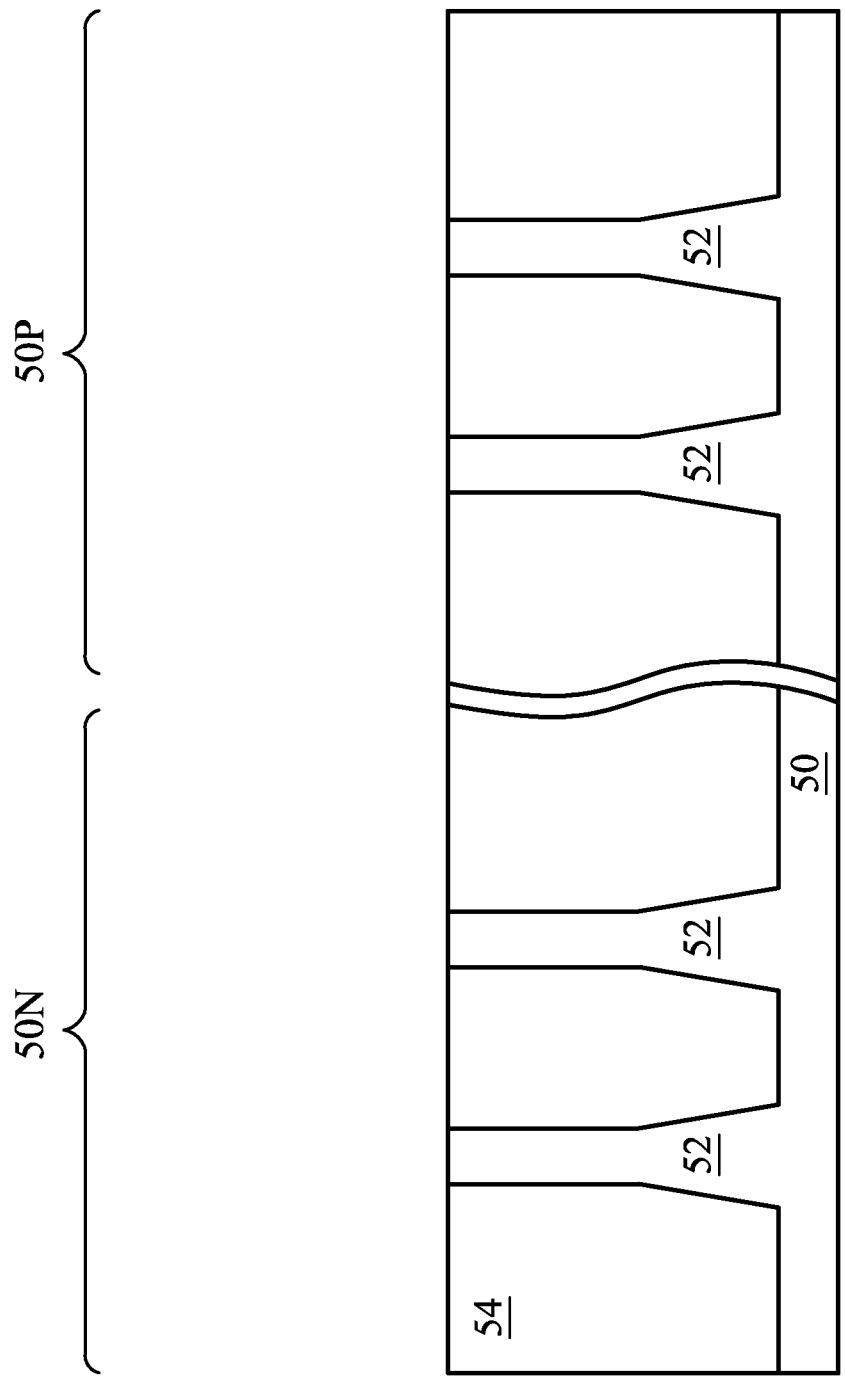

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
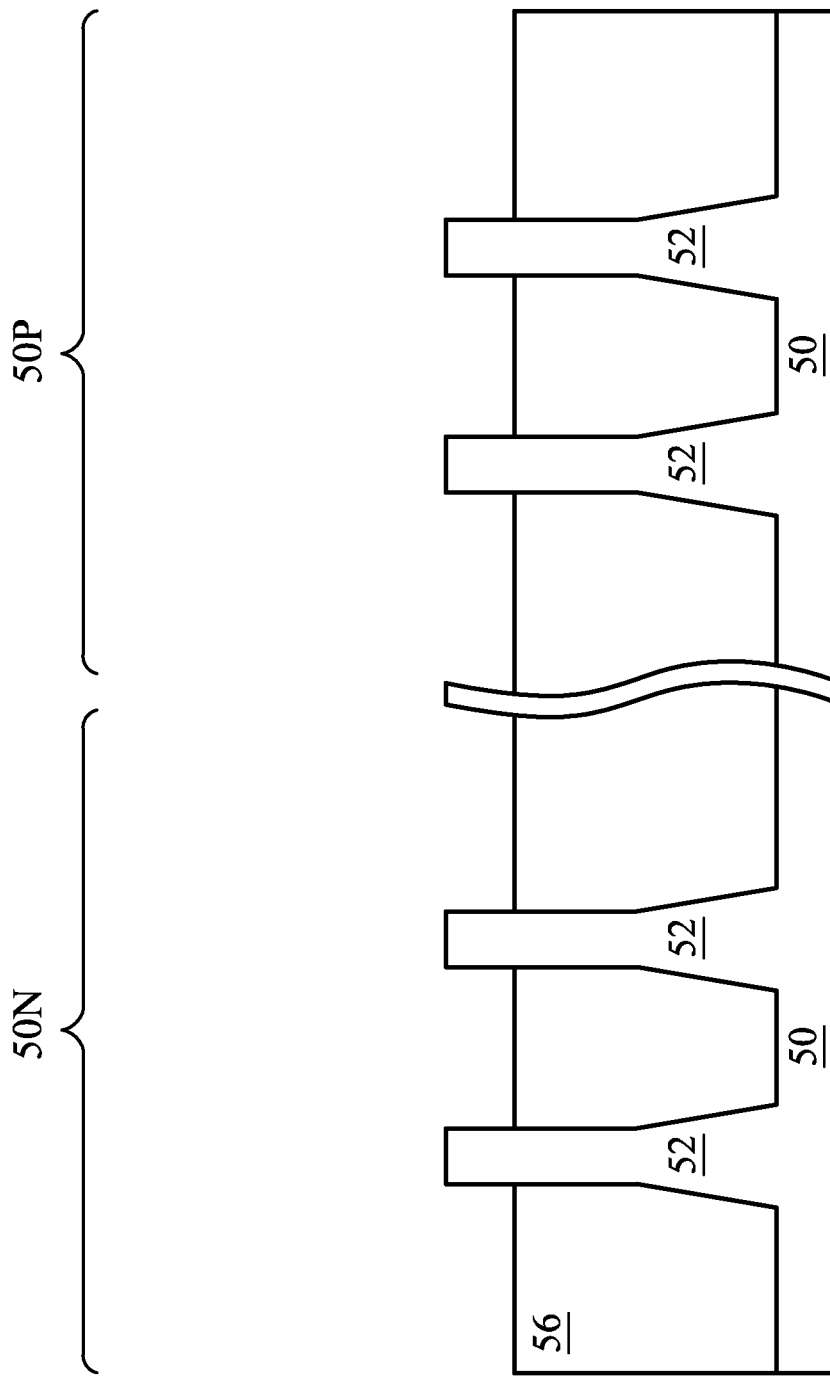

In FIG. 6, the insulation material 54 is recessed to form shallow trench isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not separately illustrated) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not separately illustrated). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
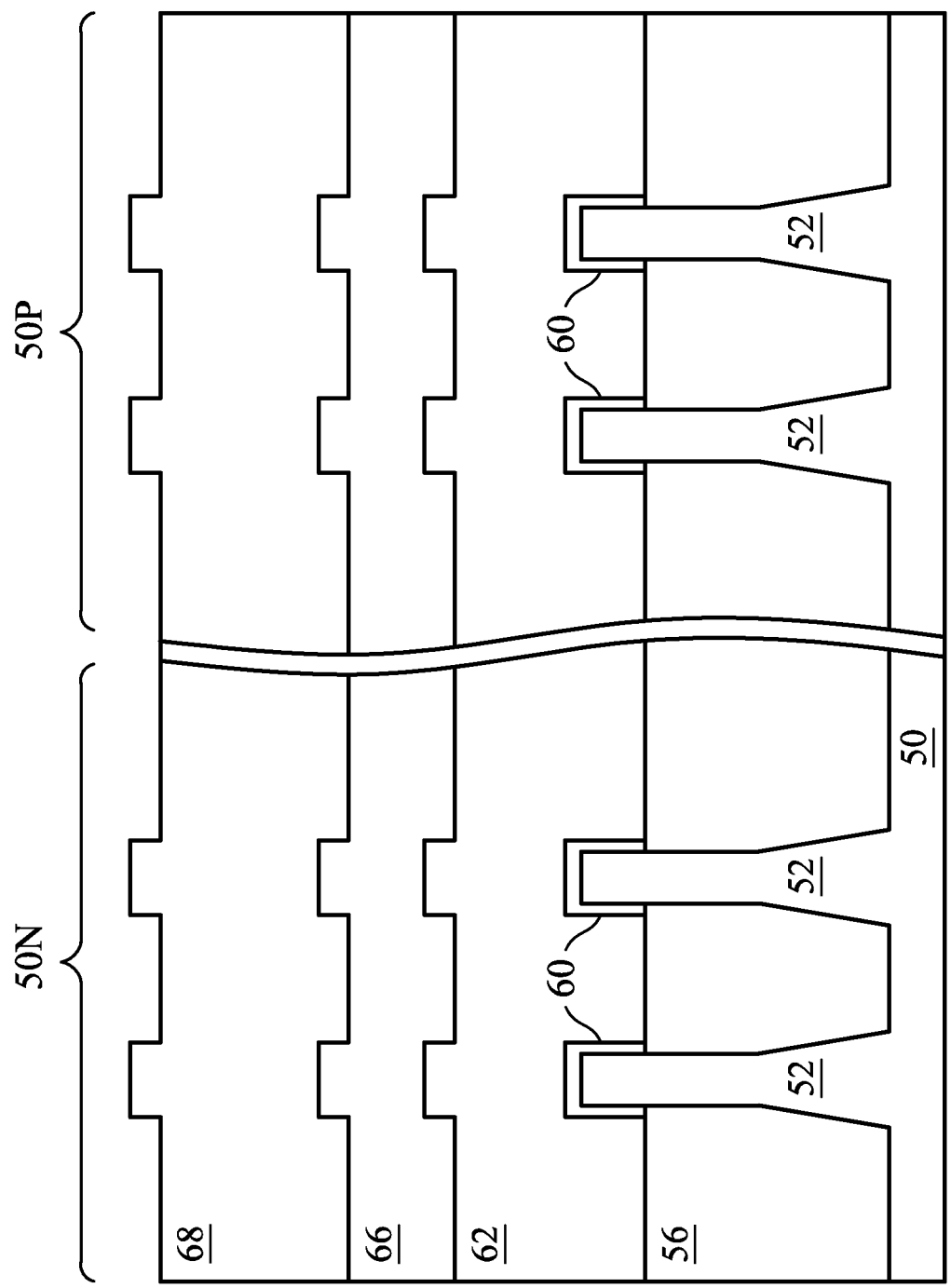

In FIG. 7, a first dummy dielectric layer 60 is formed on the fins 52. The first dummy dielectric layer 60 may be, for example, silicon oxide, silicon nitride, a combination thereof, or the like, and may be deposited or thermally grown according to acceptable techniques. A dummy gate layer 62 is formed over the first dummy dielectric layer 60, a second dummy dielectric layer 66 is formed over the dummy gate layer 62, and a sacrificial layer 68 is formed over the second dummy dielectric layer 66. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The second dummy dielectric layer 66 may be, for example, silicon oxide, silicon nitride, a combination thereof, or the like, and may be deposited or thermally grown according to acceptable techniques. The sacrificial layer 68 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. In some embodiments, the dummy gate layer 62 and the sacrificial layer 68 may be formed of polysilicon and the second dummy dielectric layer 66 may be formed of silicon nitride.

The dummy gate layer 62 and the sacrificial layer 68 may be deposited by physical vapor deposition (PVD), CVD, sputter deposition, or other techniques known and used in the art for depositing the selected material. The dummy gate layer 62 may be made of other materials that have a high etching selectivity from the etching of the STI regions 56. It is noted that the first dummy dielectric layer 60 is shown covering only the fins 52 for illustrative purposes only. In some embodiments, the first dummy dielectric layer 60 may be deposited such that the first dummy dielectric layer 60 covers the STI regions 56, extending between the dummy gate layer 62 and the STI regions 56.

The second dummy dielectric layer 66 and the sacrificial layer 68 may be formed over the dummy gate layer 62 to improve the planarization efficiency of the dummy gate layer 62. In embodiments in which the fins 52 protrude above the STI regions 56 by a distance from about 10 nm to about 50 nm, such as about 30 nm, the first dummy dielectric layer 60 may have a thickness from about 1 nm to about 5 nm, such as about 3 nm; the dummy gate layer 62 may have a thickness from about 150 nm to about 250 nm, such as about 200 nm; the second dummy dielectric layer 66 may have a thickness from about 5 nm to about 25 nm, such as about 15 nm; and the sacrificial layer 68 may have a thickness from about 150 nm to about 250 nm, such as about 200 nm.

Figure 8:
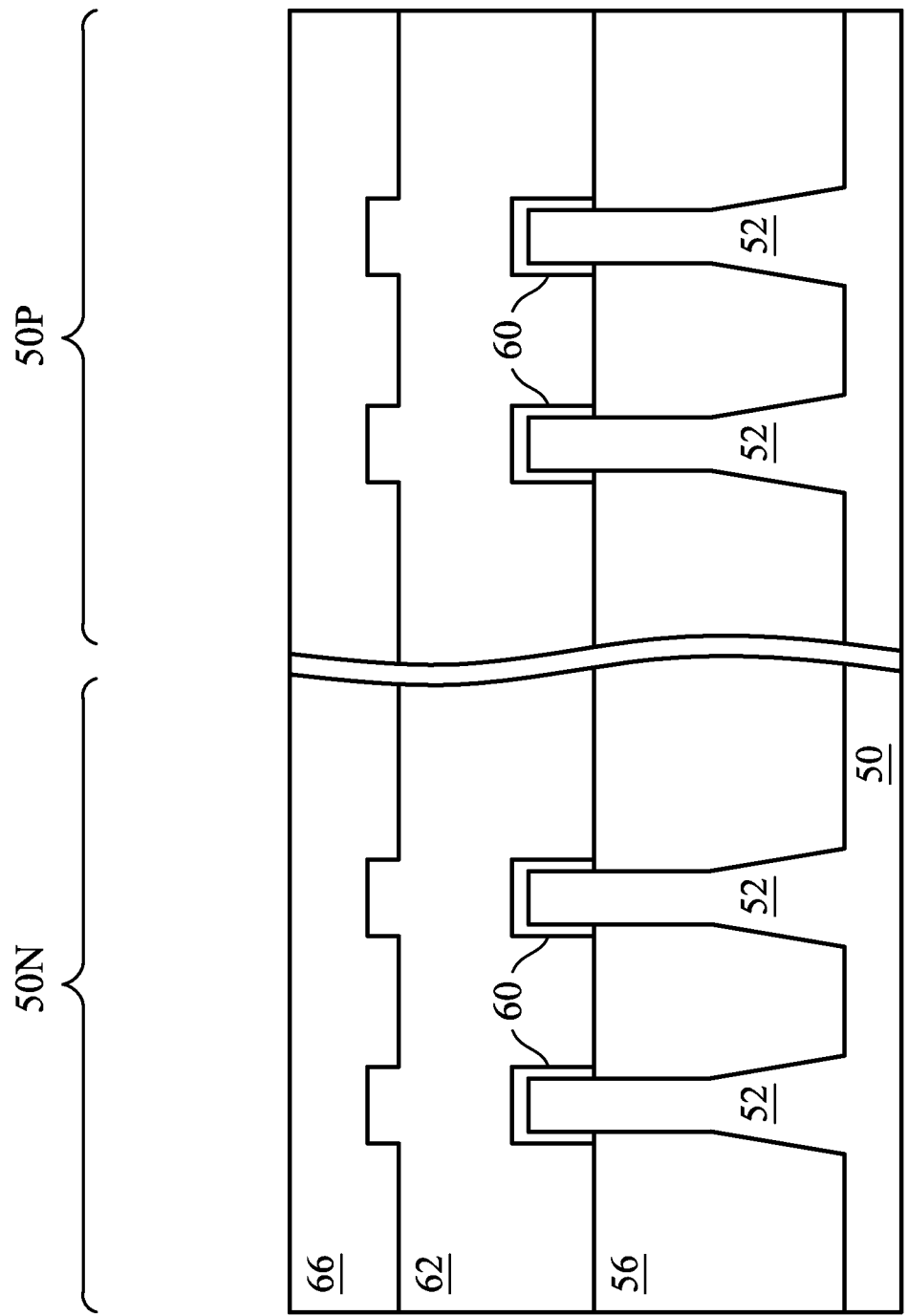

In FIG. 8, a planarization process, such as a CMP is performed on the sacrificial layer 68 and the second dummy dielectric layer 66 to remove the sacrificial layer 68 and expose and planarize a top surface of the second dummy dielectric layer 66. As will be discussed below in reference to FIG. 10, a CMP system 200 may be used to planarize the sacrificial layer 68 and the second dummy dielectric layer 66.

Figure 9:
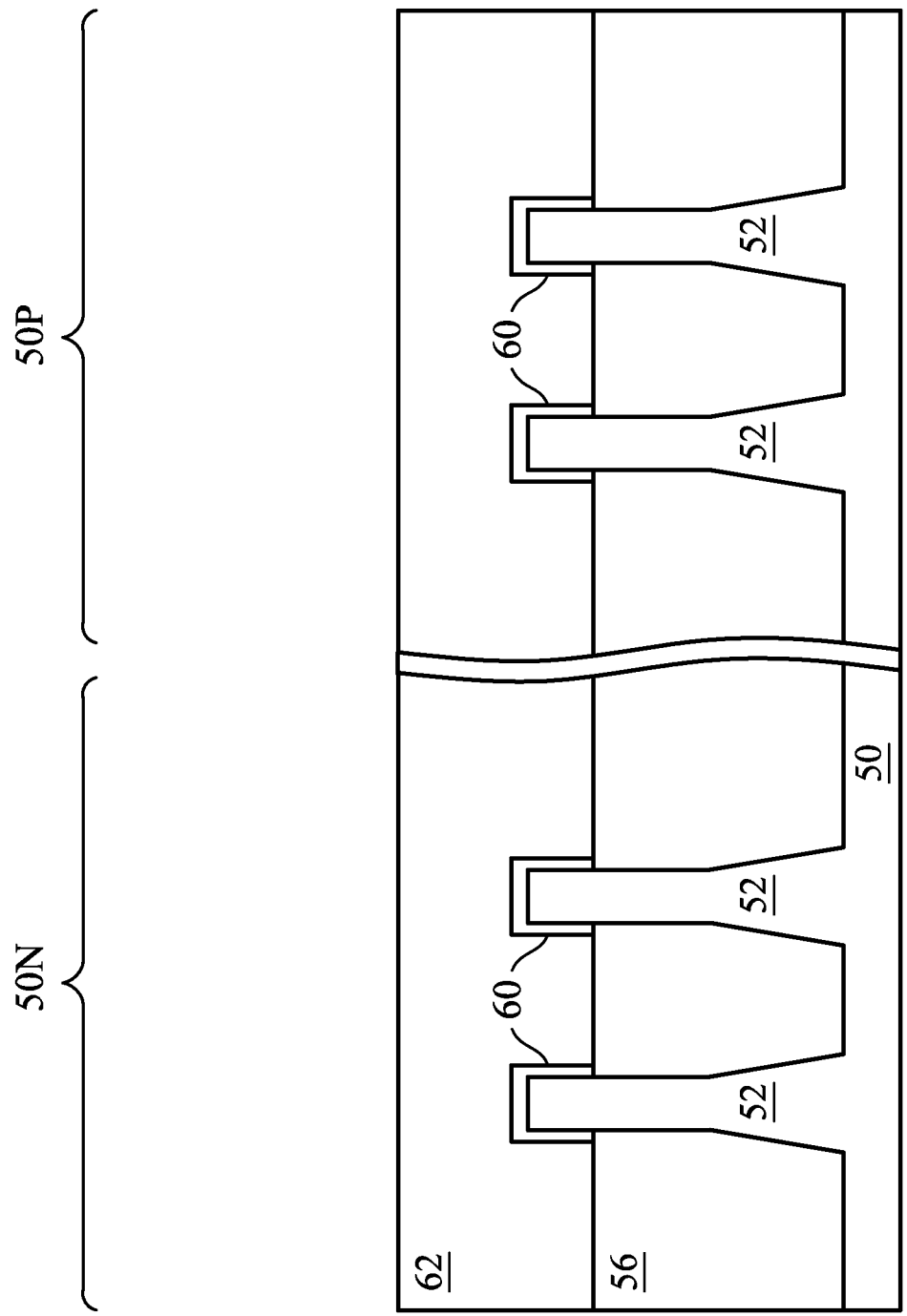

In FIG. 9, the second dummy dielectric layer 66 and the dummy gate layer 62 are etched back to expose a planar top surface of the dummy gate layer 62. A wet clean process, such as a Standard Clean-1 process, a Standard Clean-2 process, combinations thereof, or the like may be performed on the second dummy dielectric layer 66 prior to the second dummy dielectric layer 66 and the dummy gate layer 62 being etched back in order to remove fall-on particles and the like.

Various processes performed by the CMP system 200 in planarizing the sacrificial layer 68 and the second dummy dielectric layer 66 may deposit ions, such as metallic ions, on the surface of the second dummy dielectric layer 66 prior to the etch-back of the second dummy dielectric layer 66 and the dummy gate layer 62. For example, the ions may be deposited on the surface of the second dummy dielectric layer 66 from a CMP slurry used by the CMP system 200, from another solution used by the CMP system 200, from a polishing pad used by the CMP system 200, or the like. The ions may be deposited anywhere on the surface of the second dummy dielectric layer 66. The ions may mask portions of the second dummy dielectric layer 66 during the etch-back such that the masked portions of the second dummy dielectric layer 66 are not etched during the etch-back, causing humps to be formed at the top surface of the dummy gate layer 62. The humps may cause defects in resulting semiconductor devices which reduce device performance and wafer yield. As such, it is desirable to prevent the ions from being deposited on the second dummy dielectric layer 66 during the CMP by the CMP system 200. A wet clean process, such as a Standard Clean-1 process, a Standard Clean-2 process, combinations thereof, or the like may be performed on the dummy gate layer 62 after the second dummy dielectric layer 66 and the dummy gate layer 62 are etched back in order to remove fall-on particles and the like.

Figure 10:
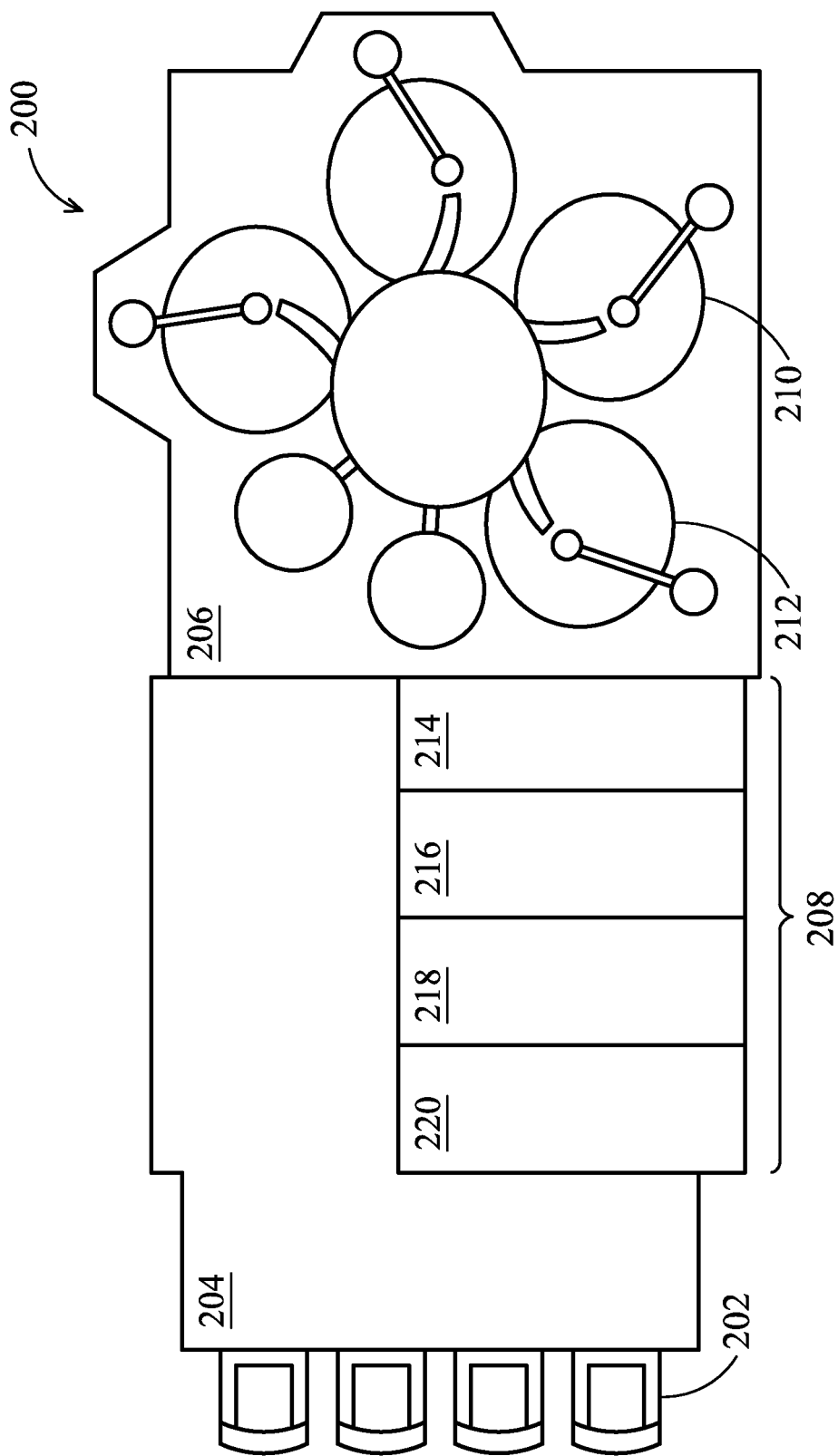
FIG. 10 illustrates a plan view of a chemical mechanical planarization (CMP) system, in accordance with some embodiments.

FIG. 10 illustrates a CMP system 200 which may be used to planarize the sacrificial layer 68 and the second dummy dielectric layer 66 disposed on the substrate 50. The CMP system 200 may include loadlocks 202, a transportation unit 204, a polishing unit 206, and a cleaning station 208. The loadlocks 202 may be used for loading substrates into the CMP system 200 and unloading substrates from the CMP system 200 once the substrates have been processed by the CMP system 200. The transportation unit 204 may be used to transport the wafers between the loadlocks 202, the polishing unit 206, and the cleaning station 208. The polishing unit 206 may include one or more CMP polishing platens, such as a high-rate platen 210 and a buffing platen 212. The high-rate platen 210 may be used for polishing and removing material from the substrates with a relatively high polishing rate, such as a bulk polishing rate, while the buffing platen 212 may be used for polishing and removing material from the substrates with a slower polishing rate and also to fix defects and scratches that may occur during the high-rate removal. The cleaning station 208 may include one or more cleaning modules, such as a tank cleaning module 214, a chemical mechanical cleaning (CMC) module 216, a brush cleaning module 218, and a vapor dryer module 220. The various modules of the cleaning station 208 may be used to remove contaminants remaining on the surfaces of the substrates following the CMP processes performed by the polishing unit 206, such as particulate, organic, and metallic contaminants.

Various solutions, such as deionized (DI) water, CMP slurry, isopropyl alcohol (IPA), other chemicals, and the like (collectively referred to as the solution) may be used throughout the processes performed by the CMP system 200. Ions, such as metallic ions which may include nickel (Ni), iron (Fe), aluminum (Al), and the like may be present in the solution and may be deposited on the substrate, such as on a top surface of the second dummy dielectric layer 66 during the processes performed by the CMP system 200. The ions may be present in the solution when fed to the CMP system 200, or may be deposited in the solution during the processes performed by the CMP system 200. For example, the ions may be deposited in the solution from polishing pads used in the polishing unit 206. The ions may act as masks during the etch-back process used to etch back, for example, the second dummy dielectric layer 66 and the dummy gate layer 62, which may result in undesirable humps being formed on the surface of the dummy gate layer 62. As such, it is desirable to remove the ions from the solution such that the ions are not deposited on the substrates and to remove any deposited ions from the substrates.

Figure 11:
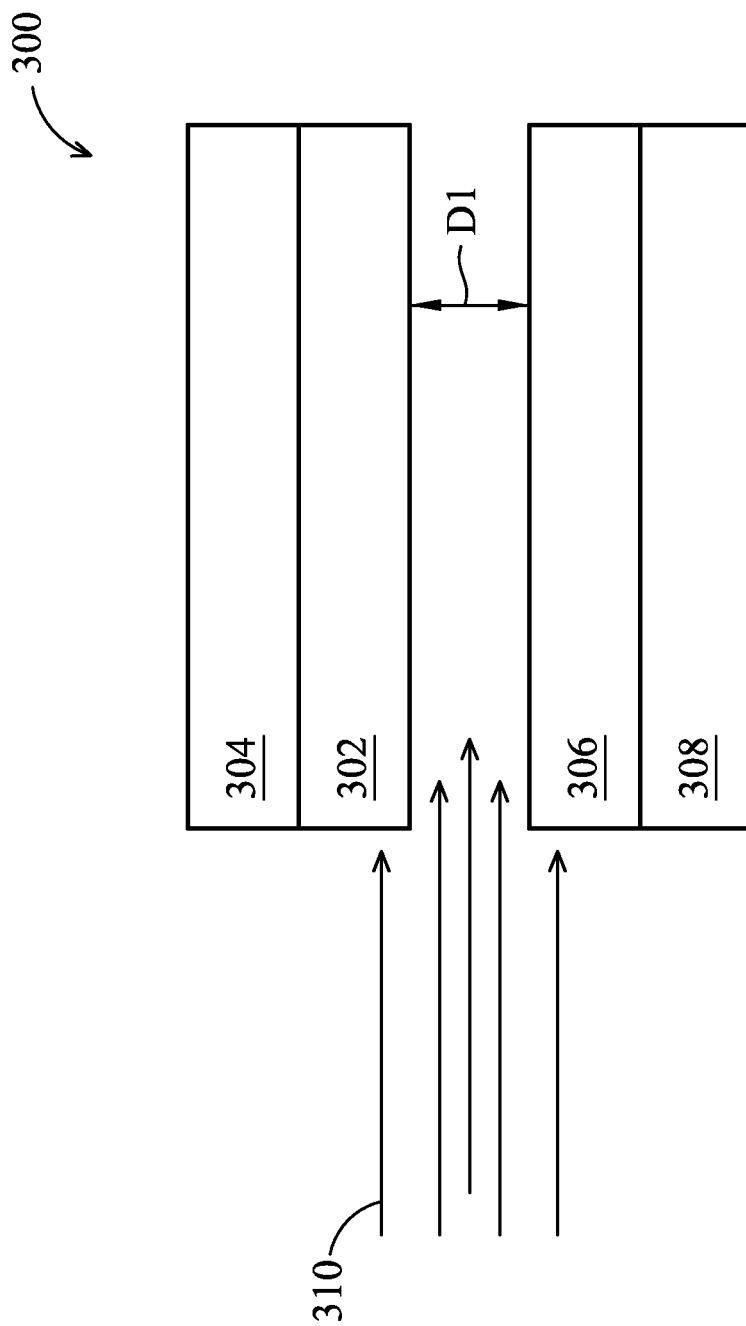
FIGS. 11, 12, 13A, 13B, 14A, and 14B illustrate cross-sectional views of capacitive deionization modules (CDMs), in accordance with some embodiments.

FIG. 11 illustrates a flow-by capacitive deionization module (CDM) 300, which may be included in the polishing platens of the polishing unit 206 and/or the cleaning modules of the cleaning station 208 and may be used to remove the ions from the solution and/or the substrates. The flow-by CDM 300 is compatible with current CMP systems. The flow-by CDM 300 may be placed anywhere in a CMP system that ions are present in order to remove the ions. FIGS. 15-19 illustrate various positions in the CMP system 200 in which CDMs such as the flow-by CDM 300 may be placed; however, the flow-by CDM 300 may be placed in any desired position in a CMP system. The flow-by CDM 300 includes a first electrode 302, a first current collector 304, a second electrode 306, and a second current collector 308. The first electrode 302 and the second electrode 306 may be formed of a porous material that allows the ions to be removed from the solution and stored therein. For example, the first electrode 302 and the second electrode 306 may be formed of activated carbon, mesoporous carbon, carbon aerogels, carbide-derived carbons, carbon nanotubes, graphene, carbon black, or the like.

The first electrode 302 or the second electrode 306 may be positively charged (e.g., an anode) and the other of the first electrode 302 or the second electrode 306 may be negatively charged (e.g., a cathode). Positively charged ions (e.g., cations) may be removed from the solution and stored in the cathode and negatively charged ions (e.g., anions) may be removed from the solution and stored in the anode. A potential difference may be applied between the first current collector 304 and the second current collector 308 in order to charge the first electrode 302 and the second electrode 306. Electrical signals such as voltage drop, current change, and the like between the first electrode 302 and the second electrode 306 may be monitored in order to monitor the life time of the flow-by CDM 300. The electrical signals may be used to determine when to switch from an adsorption phase to a desorption phase (discussed in greater detail with respect to FIGS. 13A and 13B) in order to regenerate the first electrode 302 and the second electrode 306.

As illustrated in FIG. 11, in the flow-by CDM 300, the first electrode 302 and the second electrode 306 may be separated by a distance D1. The distance D1 may be from about 0.01 cm to about 50 cm, such as about 1 cm. As indicated by arrows 310, the solution may flow through and between the first electrode 302 and the second electrode 306 in a direction parallel to major surfaces of the first electrode 302 and the second electrode 306.

The flow-by CDM 300 may be operated in a constant voltage mode or a constant current mode. In the constant voltage mode, a constant voltage is applied between the first electrode 302 and the second electrode 306. As ions are absorbed in the first electrode 302 and the second electrode 306, the potential difference between the first electrode 302 and the second electrode 306 decreases, and the rate at which ions are absorbed in the first electrode 302 and the second electrode 306 decreases. As such, the concentration of the ions in the solution may increase over time. The flow-by CDM 300 may be operated with a voltage having an absolute value from about 0 V and about 50 V, such as about 25 V in the constant voltage mode. A relatively low voltage may be used for the flow-by CDM 300 as compared with other methods for removing ions from a solution, resulting in power savings.

In the constant current mode, a constant current is applied between the first electrode 302 and the second electrode 306. In the constant current mode, ions are absorbed in the first electrode 302 and the second electrode 306 at a substantially constant rate over time and the concentration of ions in the effluent solution is constant. The voltage applied between the first electrode 302 and the second electrode 306 is increased over time in the constant current mode. The flow-by CDM 300 may operate with a current having an absolute value from about 0 A and about 30 A, such as about 15 A in the constant current mode.

Figure 12:
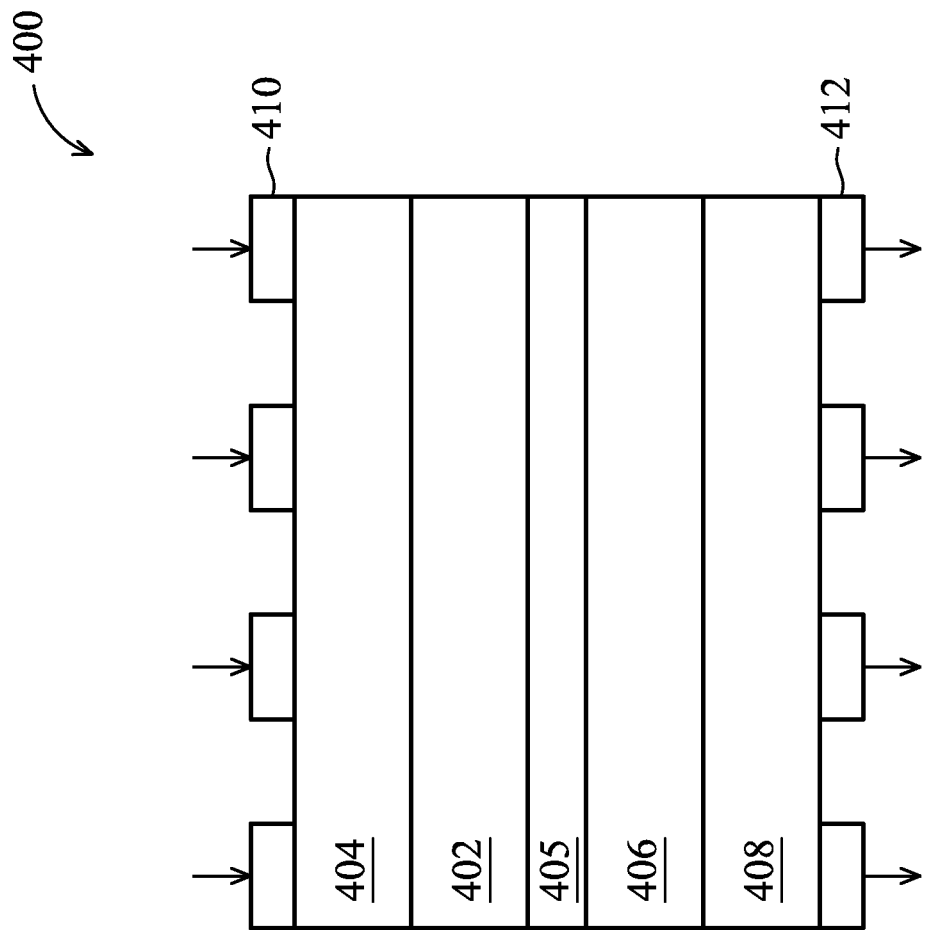

FIG. 12 illustrates a flow-through CDM 400, which may be included in the polishing platens of the polishing unit 206 and/or the cleaning modules of the cleaning station 208 and may be used to remove the ions from the solution and/or the substrates. The flow-through CDM 400 is compatible with current CMP systems. The flow-through CDM 400 may be placed anywhere in a CMP system that ions are present in order to remove the ions. FIGS. 15-19 illustrate various positions in the CMP system 200 in which CDMs such as the flow-through CDM 400 may be placed; however, the flow-through CDM 400 may be placed in any desired position in a CMP system. The flow-through CDM 400 includes a third electrode 402, a third current collector 404, a fourth electrode 406, a fourth current collector 408, and a spacer 405 separating the third electrode 402 from the fourth electrode 406. The third electrode 402 and the fourth electrode 406 may be formed of porous materials that allow the ions to be removed from the solution and stored therein. For example, the third electrode 402 and the fourth electrode 406 may be formed of activated carbon, mesoporous carbon, carbon aerogels, carbide-derived carbons, carbon nanotubes, graphene, carbon black, or the like. The spacer 405 may also be formed of a porous material that allows for the solution to flow through the spacer 405.

The third electrode 402 or the fourth electrode 406 may be positively charged (e.g., an anode) and the other of the third electrode 402 or the fourth electrode 406 may be negatively charged (e.g., a cathode). Positively charged ions (e.g., cations) may be removed from the solution and stored in the cathode and negatively charged ions (e.g., anions) may be removed from the solution and stored in the anode. A potential difference may be applied between the third current collector 404 and the fourth current collector 408 in order to charge the third electrode 402 and the fourth electrode 406. Electrical signals such as voltage drop, current change, and the like between the third electrode 402 and the fourth electrode 406 may be monitored in order to monitor the life time of the flow-through CDM 400. The electrical signals may be used to determine when to switch from an adsorption phase to a desorption phase (discussed in greater detail with respect to FIGS. 14A and 14B) in order to regenerate the third electrode 402 and the fourth electrode 406.

As illustrated in FIG. 12, in the flow-through CDM 400, the third electrode 402 is in contact with the fourth electrode 406. The flow-through CDM 400 includes inlets 410 and outlets 412. In the flow-through CDM 400, the solution flows from the inlets 410, through the third electrode 402 and the fourth electrode 406, and out of the outlets 412 in a direction perpendicular to major surfaces of the third electrode 402 and the fourth electrode 406. The flow-through CDM 400 may operate in a constant voltage mode (e.g., operated at a constant voltage from about 0 V and about 50 V, such as about 25 V) or a constant current mode (e.g., operated at a constant current from about 0 A and about 30 A, such as about 15 A) similar to the flow-by CDM 300. A relatively low voltage may be used for the flow-through CDM 400 as compared with other methods for removing ions from a solution, resulting in power savings.

Figure 13B:
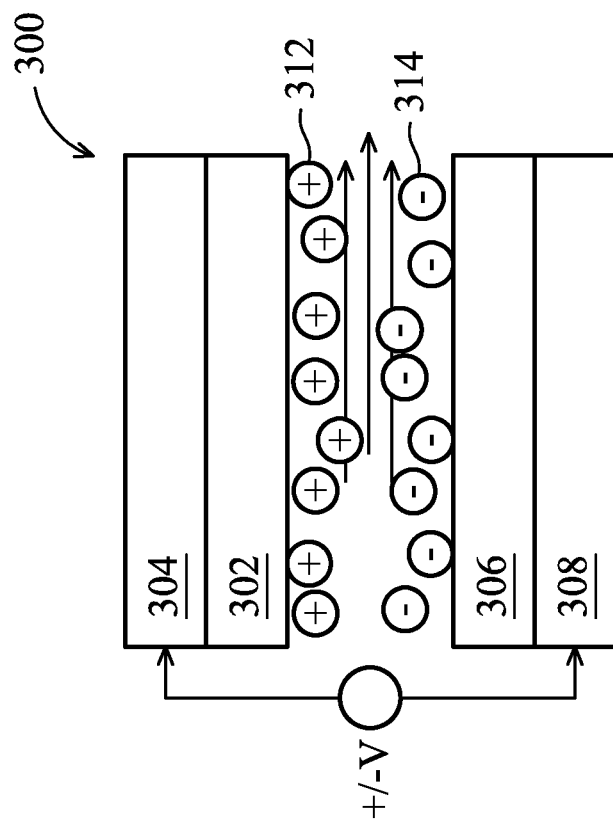
Figure 13A:
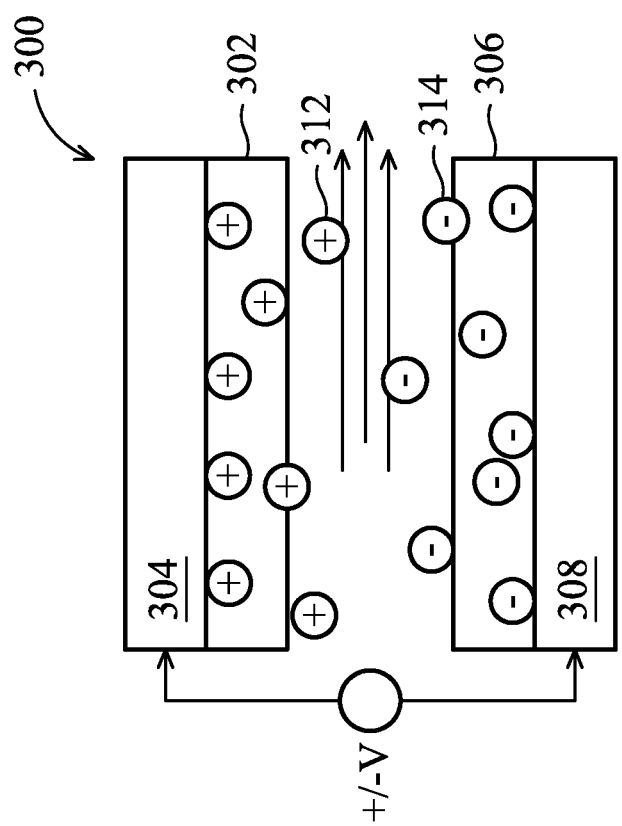

FIGS. 13A and 13B illustrate an adsorption phase and a desorption phase, respectively, for the flow-by CDM 300. During the adsorption phase, illustrated in FIG. 13A, a potential difference is applied between the first electrode 302 and the second electrode 306 and anions 314 and cations 312 present in the solution are collected in the first electrode 302 and the second electrode 306. The negatively charged anions 314 are collected in the positively charged anode (e.g., the second electrode 306 in the embodiment illustrated in FIGS. 13A and 13B) and the positively charged cations 312 are collected in the negatively charged cathode (e.g., the first electrode 302 in the embodiment illustrated in FIGS. 13A and 13B).

During the desorption phase, illustrated in FIG. 13B, the potential difference between the first electrode 302 and the second electrode 306 is reversed or reduced to zero. The anions 314 and the cations 312 collected in the first electrode 302 and the second electrode 306 are released into the solution during the desorption phase and the first electrode 302 and the second electrode 306 are thereby regenerated. The flow-by CDM 300 may regenerated in the desorption phase with solution that is not to be used in processing the substrates in the CMP system 200. Electrical signals from the first electrode 302 and the second electrode 306 such as voltage drop, current change, or the like may be monitored in order to determine when to alternate the flow-by CDM 300 between the adsorption phase and the desorption phase.

Figure 14B:
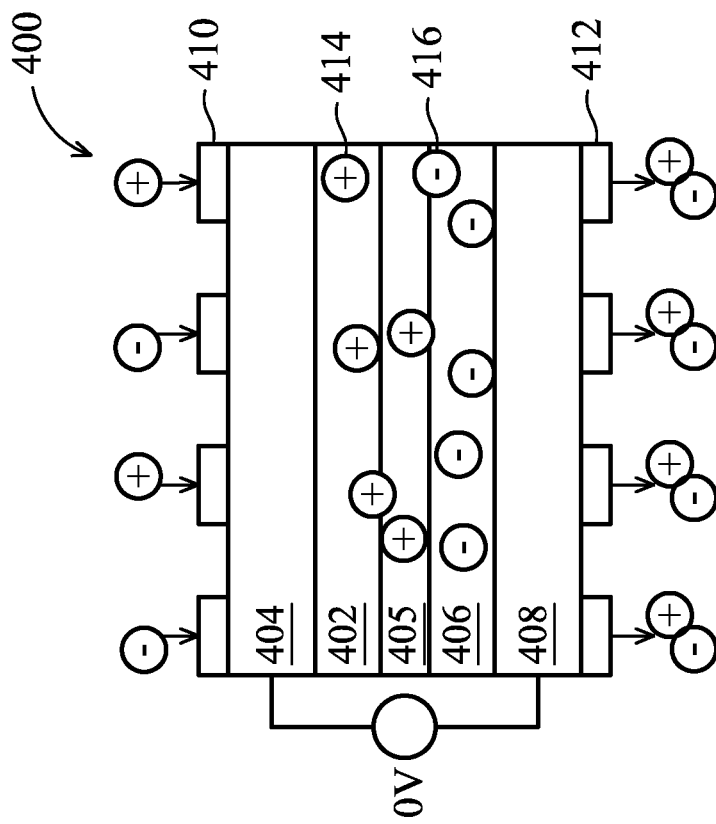
Figure 14A:
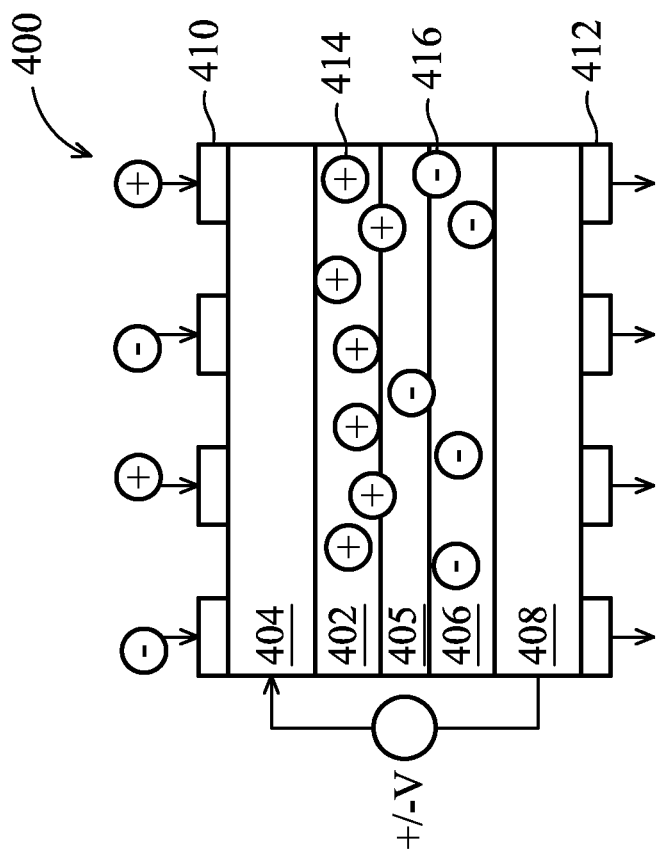

FIGS. 14A and 14B illustrate an adsorption phase and a desorption phase, respectively, for the flow-through CDM 400. During the adsorption phase, illustrated in FIG. 14A, a potential difference is applied between the third electrode 402 and the fourth electrode 406 and anions 416 and cations 414 present in the solution are collected in the third electrode 402 and the fourth electrode 406. The negatively charged anions 416 pass through the negatively charged cathode (e.g., the third electrode 402 in the embodiment illustrated in FIGS. 14A and 14B) and are collected in the positively charged anode (e.g., the fourth electrode 406 in the embodiment illustrated in FIGS. 14A and 14B) and the positively charged cations 414 are collected in the negatively charged cathode.

During the desorption phase, illustrated in FIG. 14B, the potential difference between the third electrode 402 and the fourth electrode 406 is reduced to zero. The anions 416 and the cations 414 collected in the third electrode 402 and the fourth electrode 406 are released into the solution during the desorption phase and the third electrode 402 and the fourth electrode 406 are thereby regenerated. The flow-through CDM 400 may regenerated in the desorption phase with solution that is not to be used in processing the substrates in the CMP system 200. Electrical signals from the third electrode 402 and the fourth electrode 406 such as voltage drop, current change, or the like may be monitored in order to determine when to alternate the flow-through CDM 400 between the adsorption phase and the desorption phase.

Figure 15:
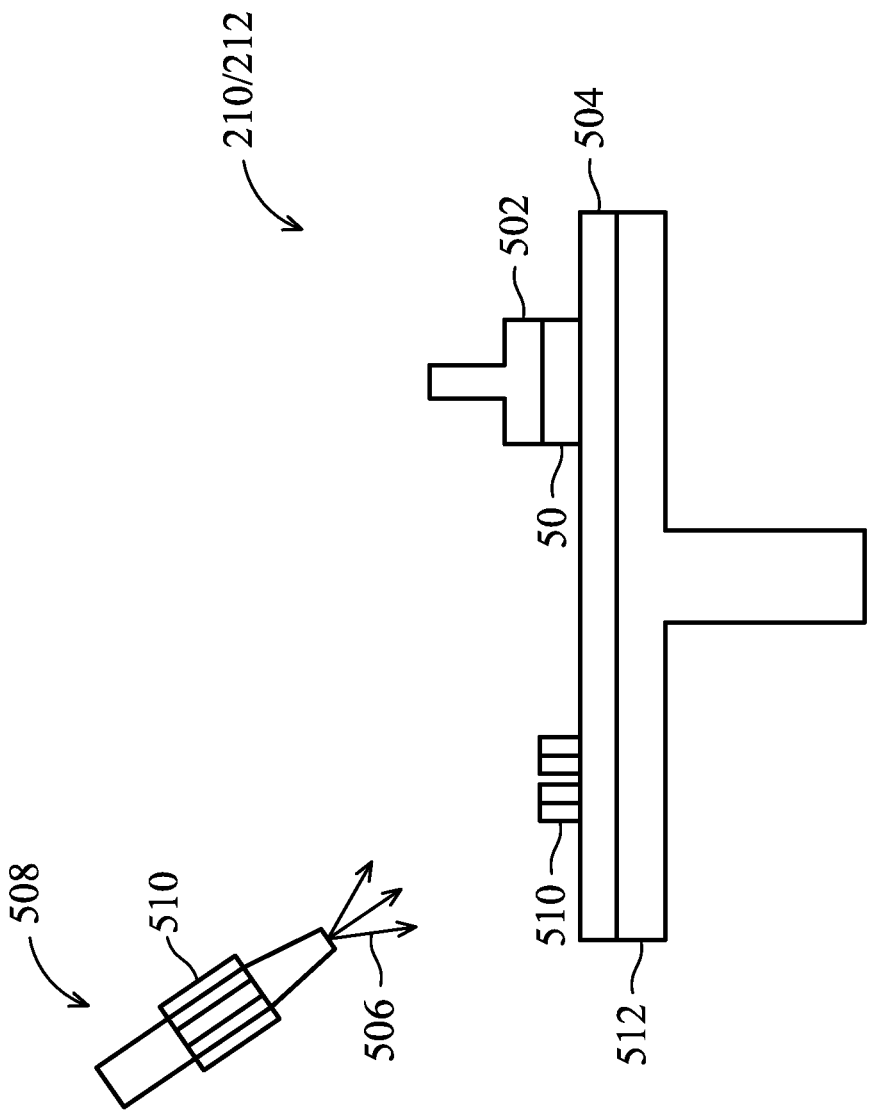
FIG. 15 illustrates a side view of a high-rate platen/buffing platen, in accordance with some embodiments.

FIG. 15 illustrates a high-rate platen 210/a buffing platen 212 which may be used to planarize the substrate 50. The buffing platen 212 may include similar components and operate in a manner similar to the high-rate platen 210, therefore the buffing platen 212 has not been separately illustrated. Differences (if any) in the structures of the high-rate platen 210 and the buffing platen 212 are described in the description of FIG. 15. In an embodiment, the substrate 50, including the second dummy dielectric layer 66 and the sacrificial layer 68 may be loaded into the CMP system 200 through the loadlocks 202 and passed to the high-rate platen 210 for a removal of the material of the second dummy dielectric layer 66 and the sacrificial layer 68. Once at the high-rate platen 210 (as illustrated in FIG. 15), the substrate 50 may be connected to a first carrier 502, which faces the substrate 50 and the sacrificial layer 68 towards a first polishing pad 504 connected to a platform 512. As illustrated in FIG. 15, the substrate 50 may be held horizontally on the first polishing pad 504.

The first polishing pad 504 may be a hard polishing pad that may be utilized for a relatively quick removal of the material of the sacrificial layer 68 and the second dummy dielectric layer 66. The buffing platen 212 may include a polishing pad having a lower hardness than the first polishing pad 504. The polishing pad of the buffing platen 212 may have a slower polishing rate and be utilized to fix defects and scratches that may occur during the high-rate removal of the first polishing pad 504. During the CMP process the first carrier 502 may press the surface of the sacrificial layer 68 against the first polishing pad 504. The substrate 50 and the first polishing pad 504 are each rotated against each other, either in the same direction or else counter-rotated in opposite directions. By rotating the first polishing pad 504 and the substrate 50 against each other, the first polishing pad 504 mechanically grinds away the material of the sacrificial layer 68 and the second dummy dielectric layer 66, thereby effectuating a removal of the material of the sacrificial layer 68 and the second dummy dielectric layer 66. Additionally, in some embodiments the first carrier 502 may move the substrate 50 back and forth along a radius of the first polishing pad 504.

Additionally, the mechanical grinding of the first polishing pad 504 may be assisted by use of a CMP slurry 506, which may be dispensed onto the first polishing pad 504 through a slurry dispensing system 508. The slurry dispensing system 508 may include a CDM 510 which may be disposed upstream of a nozzle of the slurry dispensing system 508 or the like. The CDM 510 may be a flow-by CDM (e.g., a flow-by CDM 300), a flow-through CDM (e.g., a flow-through CDM 400), or a CDM having any other configuration and may operate in the constant voltage mode, the constant current mode, or the like. The CDM 510 may remove ions from the CMP slurry 506 prior to the CMP slurry 506 coming into contact with the substrate 50 so that the ions are prevented from being deposited on the second dummy dielectric layer 66.

An additional CDM 510 may be placed on the surface of the first polishing pad 504. The CDM 510 may be placed a distance from the center of the first polishing pad 504, such as from 2 cm to 36 cm from the center of the first polishing pad 504. The CDM 510 may be disposed parallel to an edge of the first polishing pad 504, aligned with a radius of the first polishing pad 504, or the like. Multiple CDMs 510 may be placed on the surface of the first polishing pad 504. The CDM 510 disposed on the surface of the first polishing pad 504 may remove ions from the CMP slurry 506 which are present when the CMP slurry 506 is deposited and ions that the CMP slurry 506 picks up from the first polishing pad 504 or the like. The CDM 510 on the surface of the first polishing pad 504 may remove ions from the CMP slurry 506 before and after the CMP slurry 506 contacts the substrate 50 and may prevent ions from being deposited on the second dummy dielectric layer 66.

Following the CMP process, the CMP slurry 506 may be removed from the top surface of the substrate 50. For example, the CMP slurry 506 may be removed from the surface of the substrate 50 by ceasing dispensing of the CMP slurry 506 from the slurry dispensing system 508 while the first carrier 502 continues to rotate the substrate 50, such that the centrifugal force will cause the CMP slurry 506 to be removed from the surface of the substrate 50.

Figure 16:
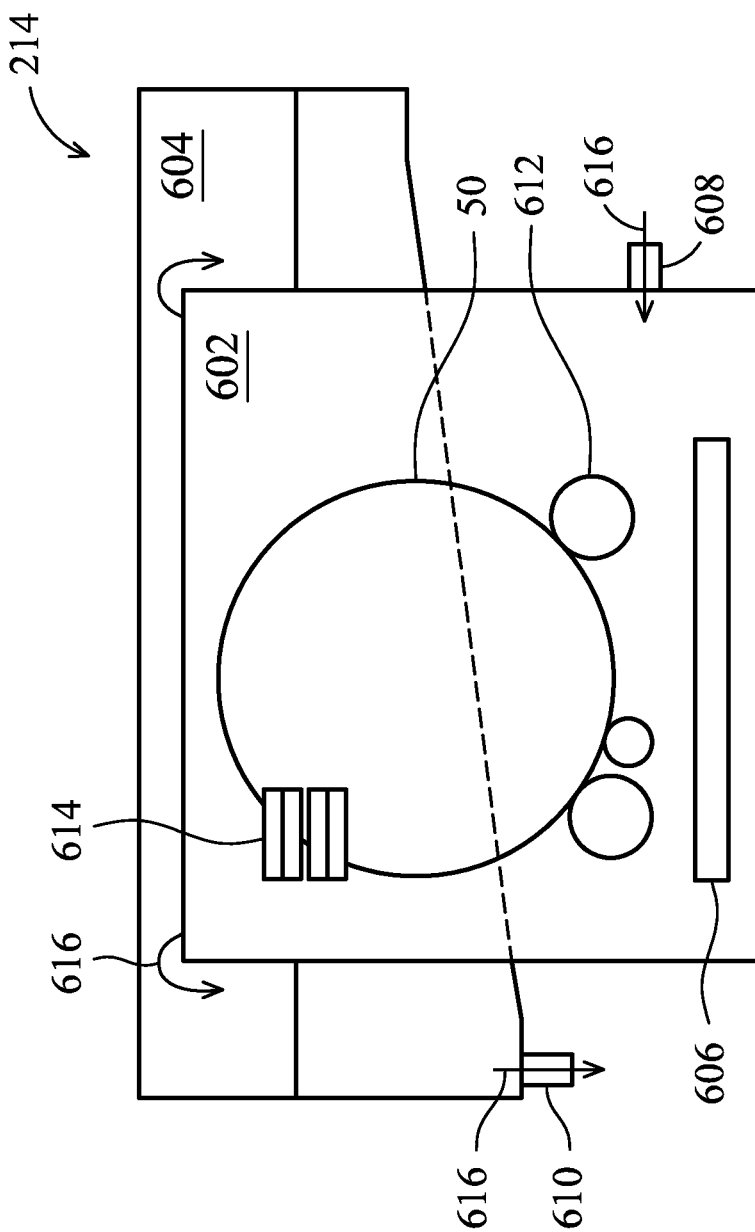
FIG. 16 illustrates a side view of a tank cleaning module, in accordance with some embodiments.

FIG. 16 illustrates a tank cleaning module 214 which may be utilized to remove contaminants remaining on the surface of the substrate 50 following the planarization by the high-rate platen 210 and the buffing platen 212. The tank cleaning module 214 includes a main tank 602, an overflow tank 604, a transducer 606, an inlet 608, an outlet 610, wafer holders 612, and a CDM 614. As illustrated by the arrows 616, cleaning solution may enter the main tank 602 through the inlet 608, used cleaning solution may overflow the main tank 602 to the overflow tank 604, and the used cleaning solution may exit the outlet 610. Contaminants removed from the surfaces of the substrate 50 may rise to the top of the cleaning solution and be transported into the overflow tank 604. The transducer 606 may be a megasonic transducer or an ultrasonic transducer and may generate an acoustic field at a frequency from about 0.8 MHz to about 2 MHz, from about 20 kHz to about 200 kHz, or the like. The acoustic field generated by the transducer 606 causes cavitation, which aids in cleaning the substrate 50. The wafer holders 612 may hold the substrate 50 in the main tank 602 and may include rollers that rotate the substrate 50. Although the substrate 50 is illustrated as being held vertically in the main tank 602 by the wafer holders 612, in some embodiments the wafer holders 612 may hold the substrate 50 horizontally in the main tank 602. The cleaning solution may be any solution for cleaning semiconductor substrates and may include DI water, hydrochloric acid (HCl), hydrogen peroxide ($H_2O_2$), ammonia ($NH_3$), hydrofluoric acid (HF), any other weak or strong acid, any other weak or strong base, combinations thereof, or the like.

The CDM 614 may be a flow-by CDM (e.g., a flow-by CDM 300), a flow-through CDM (e.g., a flow-through CDM 400), or a CDM having any other configuration and may operate in the constant voltage mode, the constant current mode, or the like. The CDM 614 may remove ions from the cleaning solution present in the main tank 602 such that the ions are removed from the second dummy dielectric layer 66. As illustrated in FIG. 16, the CDM 614 may be disposed in the main tank 602. Although only one CDM 614 is illustrated in FIG. 16, multiple CDMs 614 may be disposed in the main tank 602. The CDMs 614 may be submerged in the cleaning solution present in the main tank 602. In some embodiments, CDMs 614 may be disposed at the inlet 608, at the outlet 610, or the like.

Figure 17:
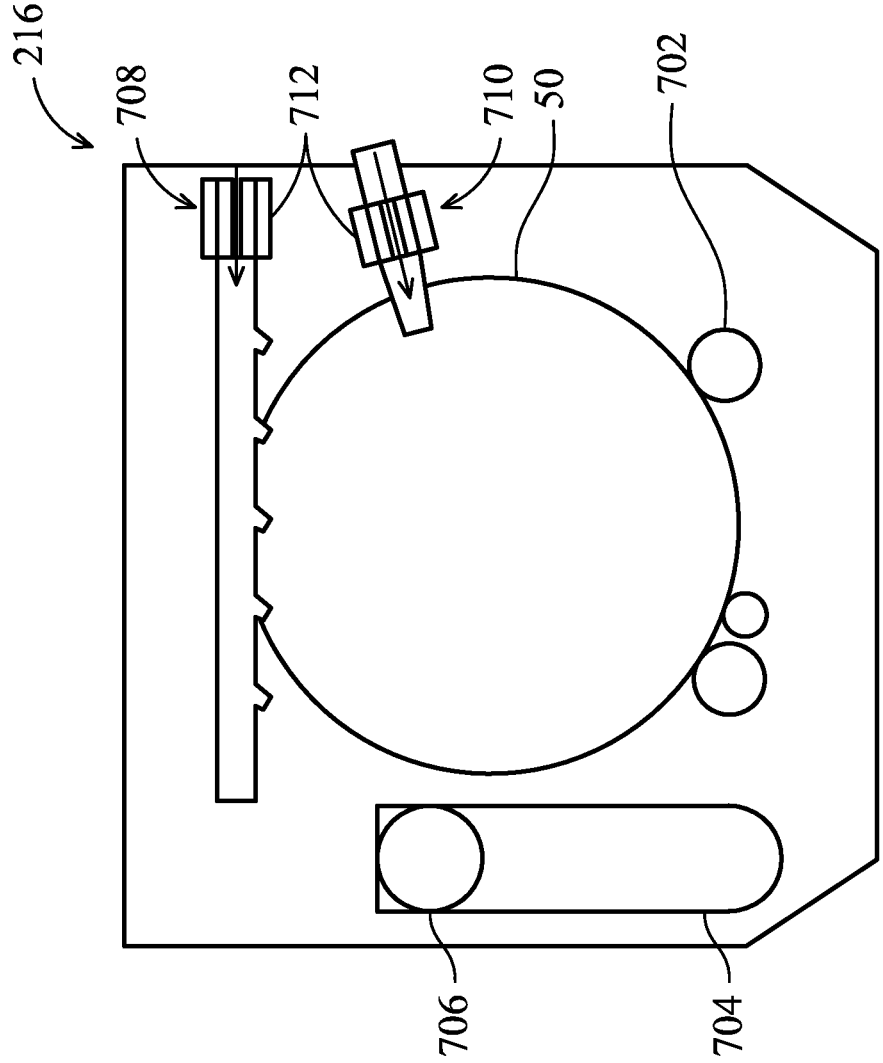
FIG. 17 illustrates a side view of a chemical mechanical cleaning module, in accordance with some embodiments.

FIG. 17 illustrates a CMC module 216 which may be utilized to remove contaminants remaining on the surface of the substrate 50 following the cleaning performed by the tank cleaning module 214. The CMC module 216 includes wafer holders 702, a swing arm 704, a buff pad 706, a spray bar 708, and a nozzle 710. The wafer holder 702 holds the substrate 50 and may include rollers that rotate the substrate 50. The swing arm 704 moves the buff pad 706 over the surface of the substrate 50. The buff pad 706 is configured to clean the surface of the substrate 50 and may rotate in a direction parallel to a major surface of the substrate 50. The buff pad 706 and the substrate 50 may rotate in the same direction or opposite directions. The substrate 50 may be held vertically in the CMC module 216.

The nozzle 710 and the spray bar 708 may each be configured to spray a cleaning solution onto the surface of the substrate 50. The cleaning solution may be any solution for cleaning semiconductor substrates and may include DI water, hydrochloric acid (HCl), hydrogen peroxide ($H_2O_2$), ammonia ($NH_3$), hydrofluoric acid (HF), any other weak or strong acid, any other weak or strong base, combinations thereof, or the like. In some embodiments, the nozzle 710 may be configured to spray a cleaning solution configured to remove particulates from the surface of the substrate 50 onto the substrate 50 and the spray bar 708 may be configured to spray DI water onto the substrate 50 to rinse the substrate 50.

CDMs 712 may be included in the nozzle 710 and the spray bar 708 in order to remove ions from the cleaning solution sprayed from the nozzle 710 and the spray bar 708. As illustrated in FIG. 17, the CDMs 712 may be placed upstream of the nozzles in the spray bar 708, upstream of the nozzle 710, or the like. The CDMs 712 may be flow-by CDMs (e.g., flow-by CDMs 300), flow-through CDMs (e.g., flow-through CDMs 400), or CDMs having any other configuration and may operate in the constant voltage mode, the constant current mode, or the like. The CDMs 712 may prevent ions present in the cleaning solution from being deposited on the substrate 50.

Figure 18:
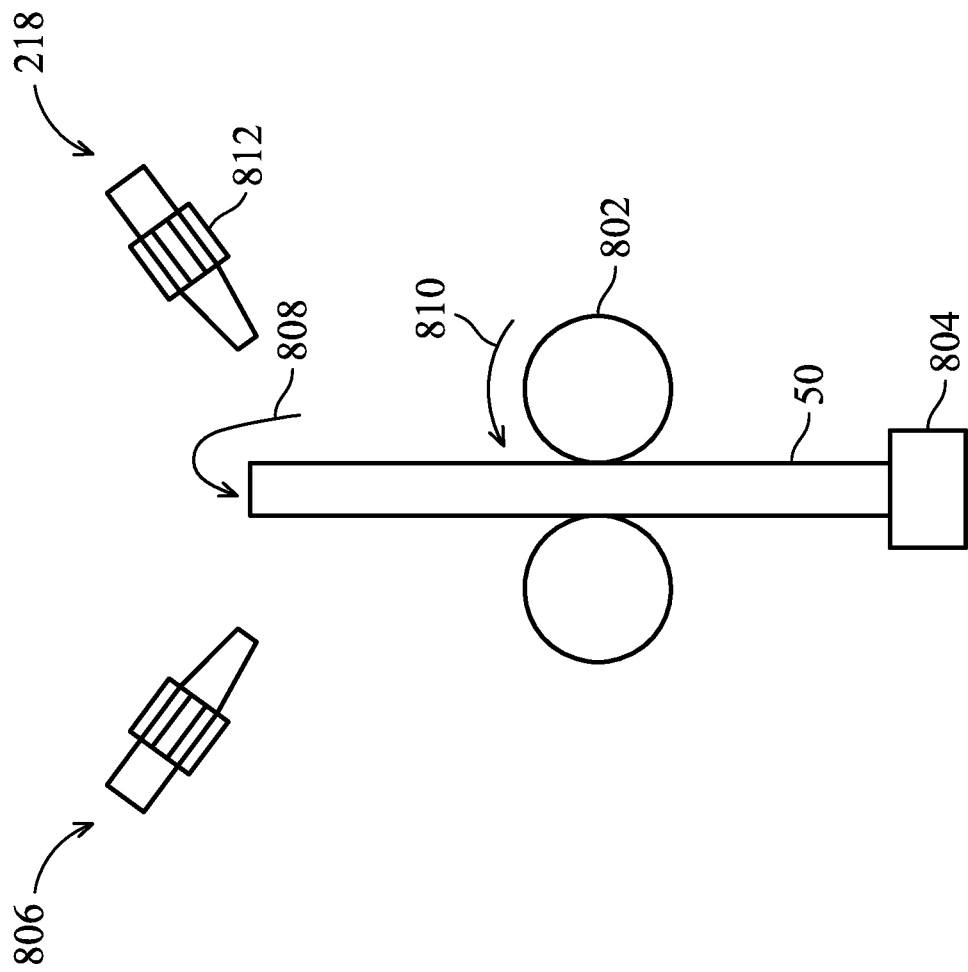
FIG. 18 illustrates a side view of a brush cleaning module, in accordance with some embodiments.

FIG. 18 illustrates a brush cleaning module 218 which may be utilized to remove contaminants remaining on the surface of the substrate 50 following the cleaning performed by the CMC module 216. The brush cleaning module 218 may include brushes 802, a wafer holder 804, and nozzles 806. The wafer holder 804 holds the substrate 50 and may include rollers that rotate the substrate 50. The wafer holder 804 may rotate the substrate 50 in a direction parallel to major surfaces of the substrate 50, as illustrated by the arrow 808. As illustrated in FIG. 18, the brushes 802 may be disposed on either side of the substrate 50. The brushes 802 may be brush rollers and have a generally cylindrical shape. The brushes 802 may be formed of a material such as polyvinyl alcohol or the like. The brushes 802 may rotate on their own axes in directions illustrated by the arrows 810. The brushes 802 disposed on opposite sides of the substrate 50 may rotate in the same direction or opposite directions.

The nozzles 806 may spray a cleaning solution at the substrate 50 while the substrate 50 is cleaned by the brushes 802. The cleaning solution may be any solution for cleaning semiconductor substrates and may include DI water, hydrochloric acid (HCl), hydrogen peroxide ($H_2O_2$), ammonia ($NH_3$), hydrofluoric acid (HF), any other weak or strong acid, any other weak or strong base, combinations thereof, or the like. The nozzles 806 may include CDMs 812, which may remove ions from the cleaning solution sprayed from the nozzles 806. As illustrated in FIG. 18, the CDMs 812 may be placed upstream of the nozzles 806. The CDMs 812 may be flow-by CDMs (e.g., flow-by CDMs 300), flow-through CDMs (e.g., flow-through CDMs 400), or CDMs having any other configuration and may operate in the constant voltage mode, the constant current mode, or the like. The CDMs 812 may prevent ions present in the cleaning solution from being deposited on the substrate 50.

Figure 19:
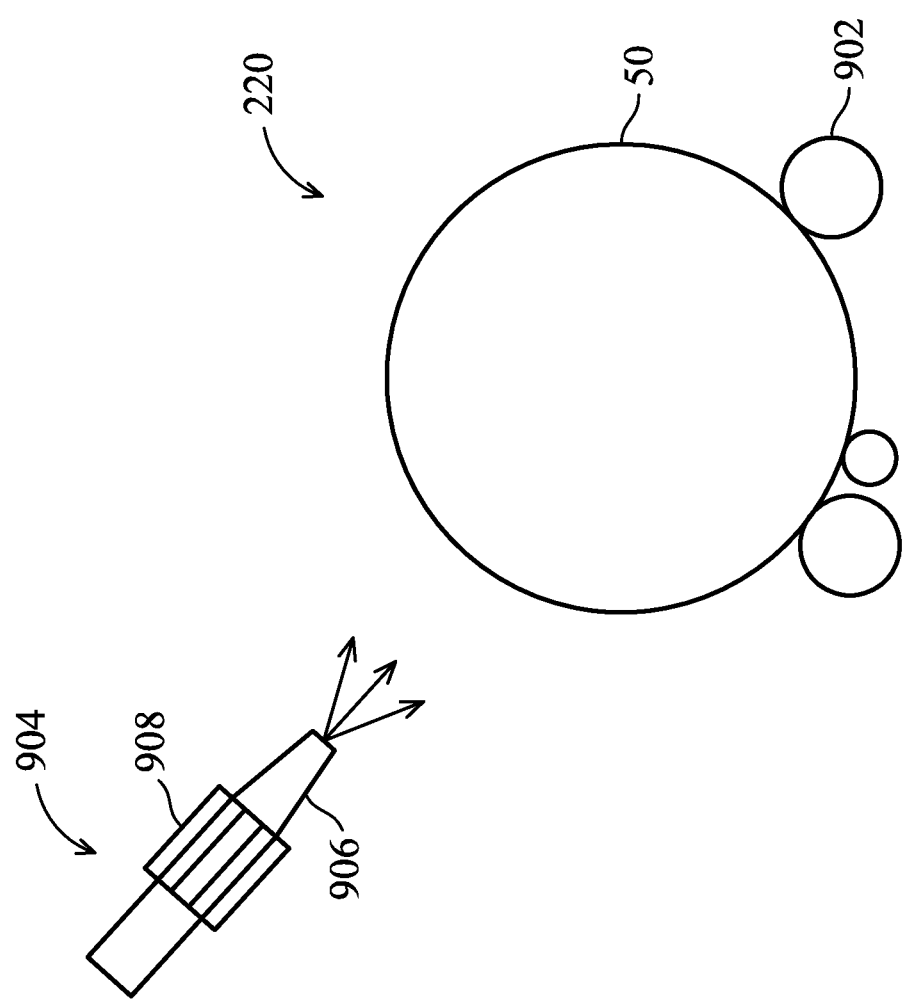
FIG. 19 illustrates a side view of a vapor dryer module, in accordance with some embodiments.

FIG. 19 illustrates a vapor dryer module 220 used to rinse and dry the substrate 50 after the substrate is cleaned by the brush cleaning module 218. The vapor dryer module 220 includes wafer holders 902 and a nozzle 904. The wafer holders 902 may hold the substrate 50 horizontally or vertically and may rotate the wafer in a direction parallel to major surfaces of the substrate 50. The nozzle 904 may be used to spray drying solutions 906 onto the substrate 50 to rinse and dry the substrate 50. The nozzle 904 may spray DI water onto the substrate 50, followed by isopropyl alcohol and may take advantage of the Marangoni effect to dry the substrate 50.

The nozzles 904 may include CDMs 908, which may remove ions from the drying solutions 906 sprayed from the nozzles 904. As illustrated in FIG. 19, the CDMs 908 may be placed upstream of the nozzles 904. The CDMs 908 may be flow-by CDMs (e.g., flow-by CDMs 300), flow-through CDMs (e.g., flow-through CDMs 400), or CDMs having any other configuration and may operate in the constant voltage mode, the constant current mode, or the like. The CDMs 908 may prevent ions present in the drying solutions 906 from being deposited on the substrate 50.

Although the cleaning process performed by the cleaning station 208 has been described as proceeding from the tank cleaning module 214 to the CMC module 216 to the brush cleaning module 218, any number of cleaning modules may be included and the substrate 50 may proceed through the cleaning modules in any order to remove contaminants from the substrate 50. Including the various CDMs in the modules of the cleaning station 208 and the CMP polishing platens of the polishing unit 206 allows for ions to be removed from the various solutions which interact with the substrate 50 and prevents the ions from being deposited on the surface of the second dummy dielectric layer 66. This prevents the ions from masking the second dummy dielectric layer 66 during the etch-back process described in relation to FIG. 9, which prevents defects such as humps being formed in the surface of the dummy gate layer 62. As such, device performance and device yield are both increased.

Figure 20:
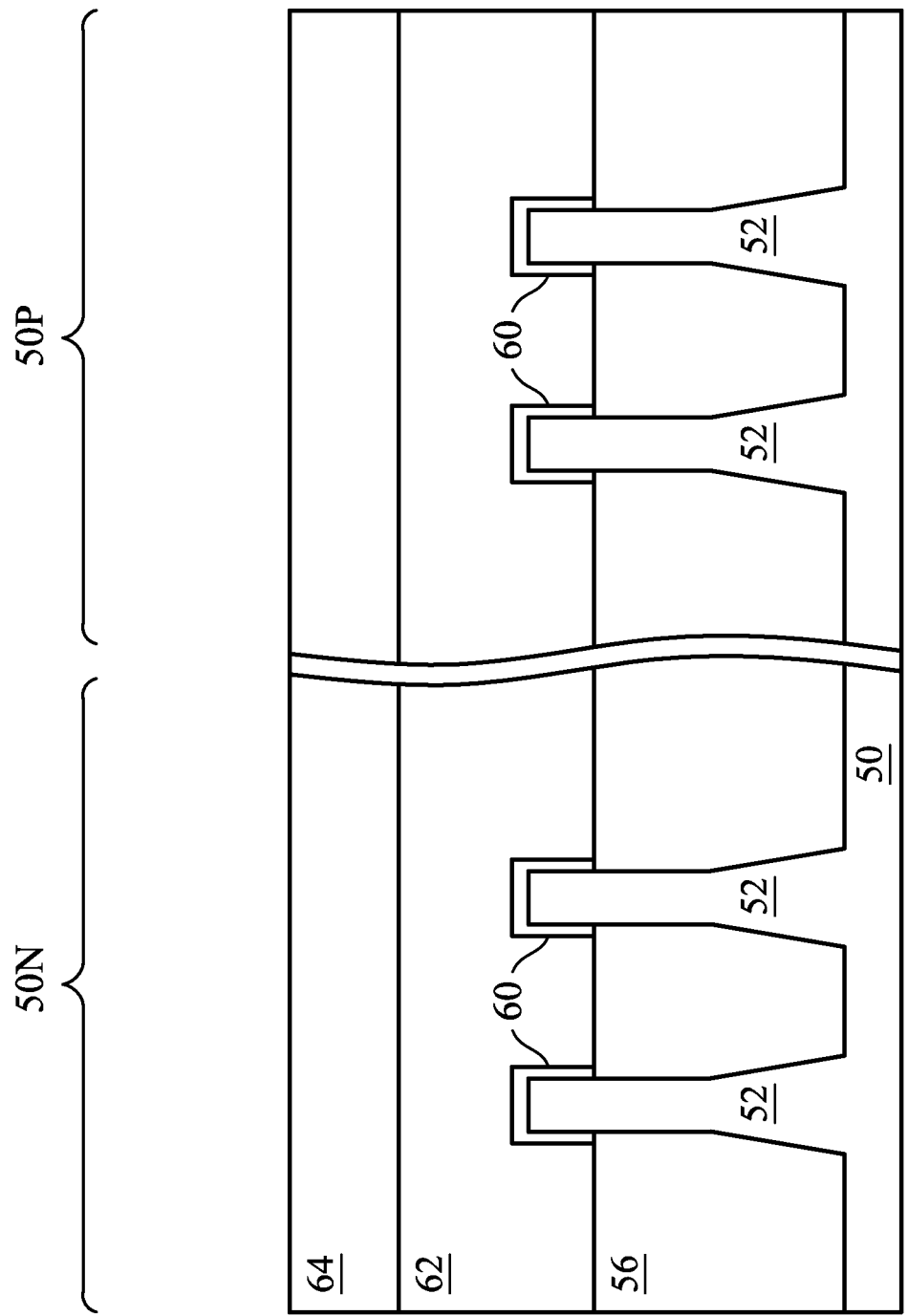
FIGS. 20, 21A, 21B, 22A, 22B, 23A, 23B, 23C, 23D, 24A, 24B, 25A, 25B, 26A, 26B, 27A, 27B, 27C, 28A, 28B, 29A, and 29B illustrate cross-sectional views of intermediate stages in the manufacturing of FinFETs, in accordance with some embodiments.

In FIG. 20, a mask layer 64 is formed on the dummy gate layer 62. The mask layer 64 may include, for example, silicon nitride, silicon oxynitride, tetraethyl orthosilicate (TEOS), combinations or multiple layers thereof, or the like. In this example, a single dummy gate layer 62 and a single mask layer 64 are formed across the region 50N and the region 50P. A wet clean process, such as a Standard Clean-1 process, a Standard Clean-2 process, combinations thereof, or the like may be performed on the mask layer 64 after depositing the mask layer 64 in order to remove fall-on particles and the like.

FIGS. 21A through 29B illustrate various additional steps in the manufacturing of embodiment devices. FIGS. 21A through 29B illustrate features in either of the region 50N and the region 50P. For example, the structures illustrated in FIGS. 21A through 29B may be applicable to both the region 50N and the region 50P. Differences (if any) in the structures of the region 50N and the region 50P are described in the text accompanying each figure.

Figure 21B:
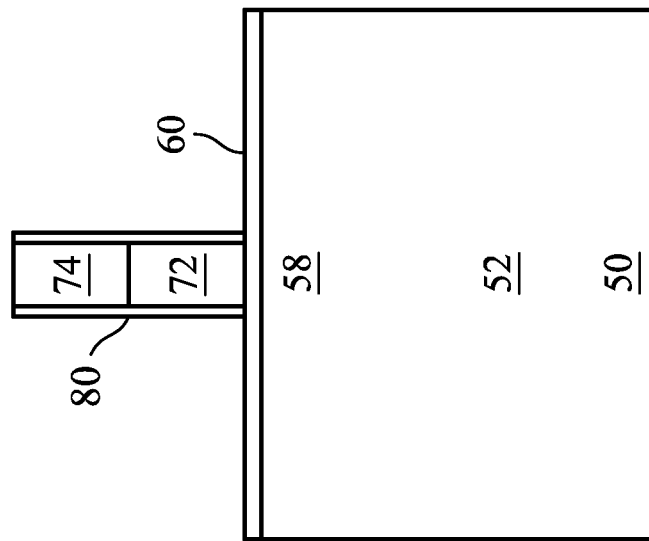
Figure 21A:
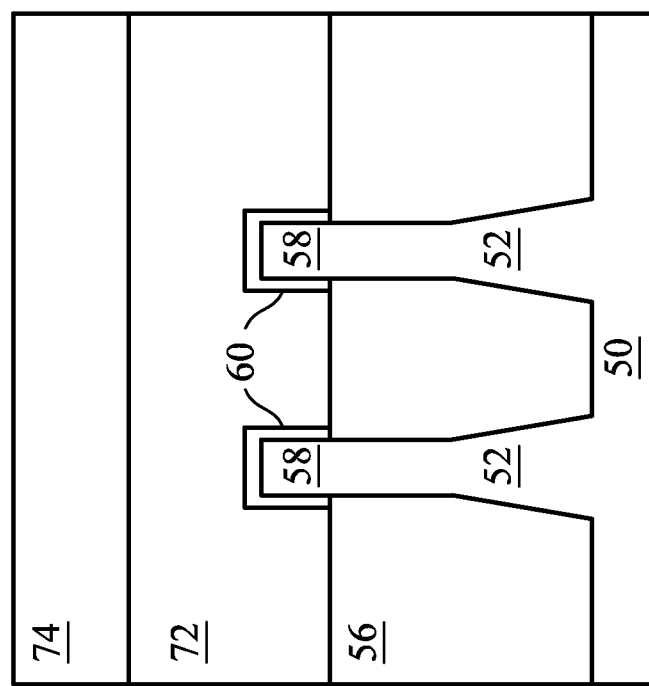

In FIGS. 21A and 21B, the mask layer 64 (see FIG. 20) may be patterned using acceptable photolithography and etching techniques to form masks 74. The pattern of the masks 74 then may be transferred to the dummy gate layer 62. In some embodiments (not separately illustrated), the pattern of the masks 74 may also be transferred to the first dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 21A and 21B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 22B:
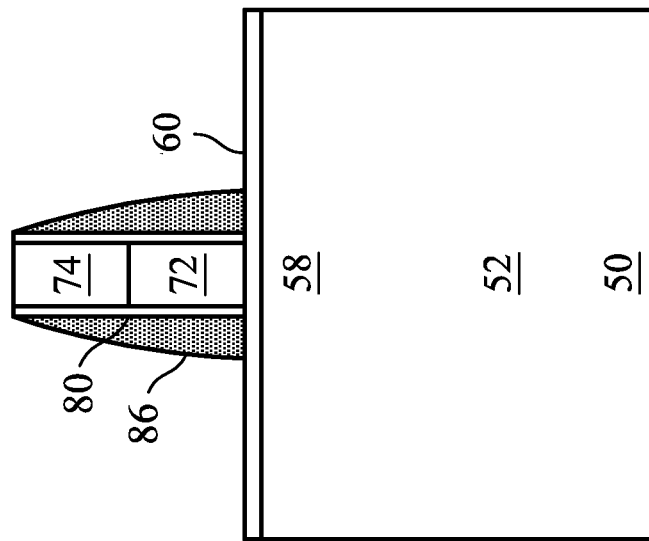
Figure 22A:
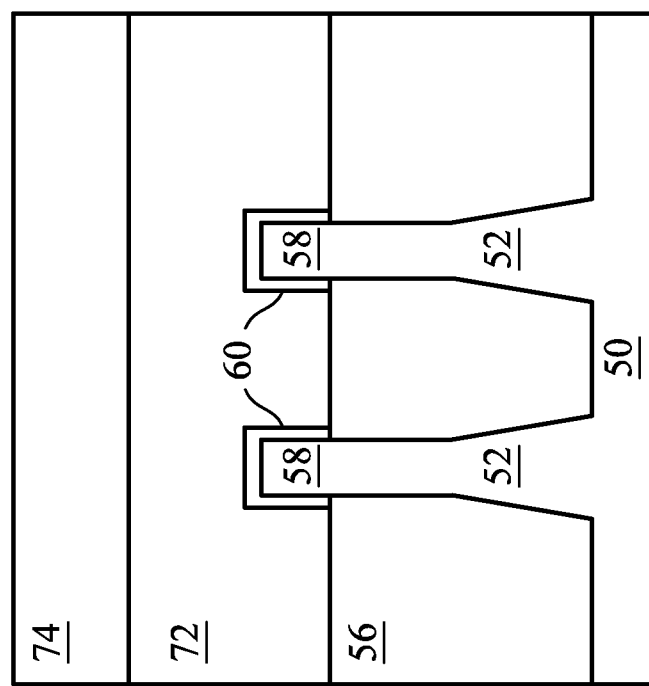

In FIGS. 22A and 22B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 23B:
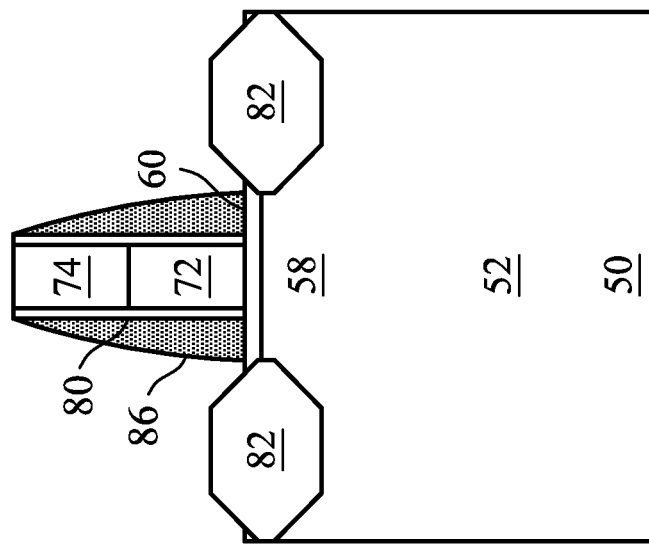
Figure 23A:
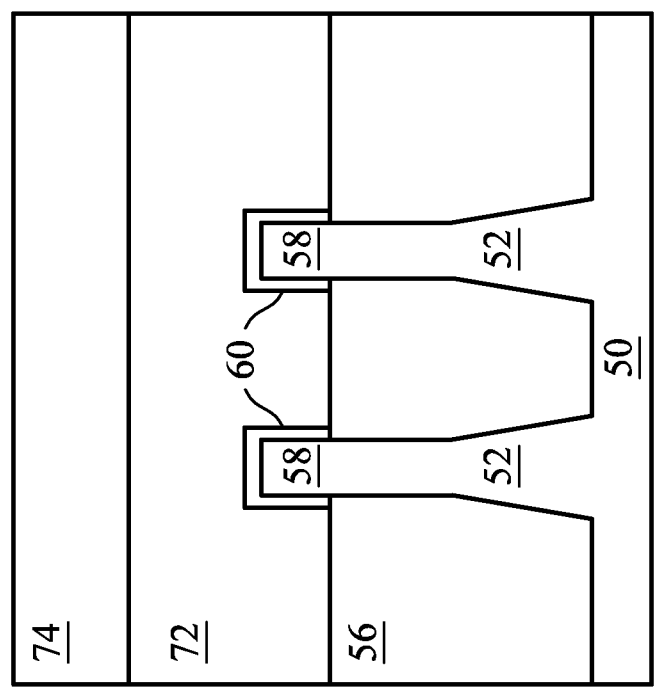
Figure 23C:
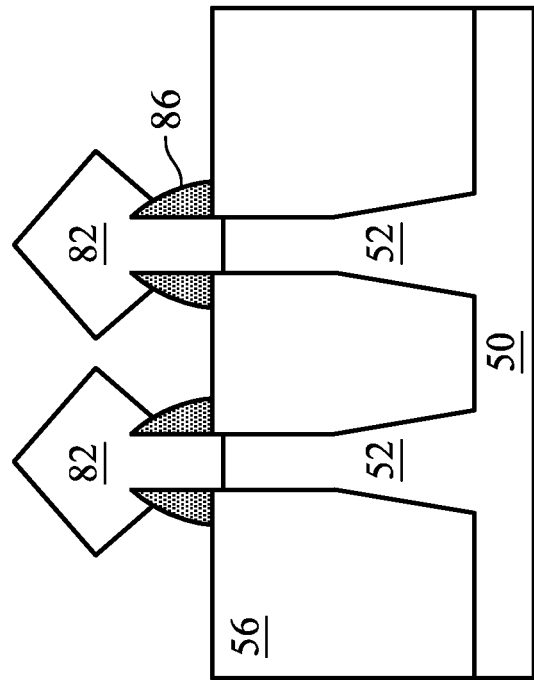
Figure 23D:
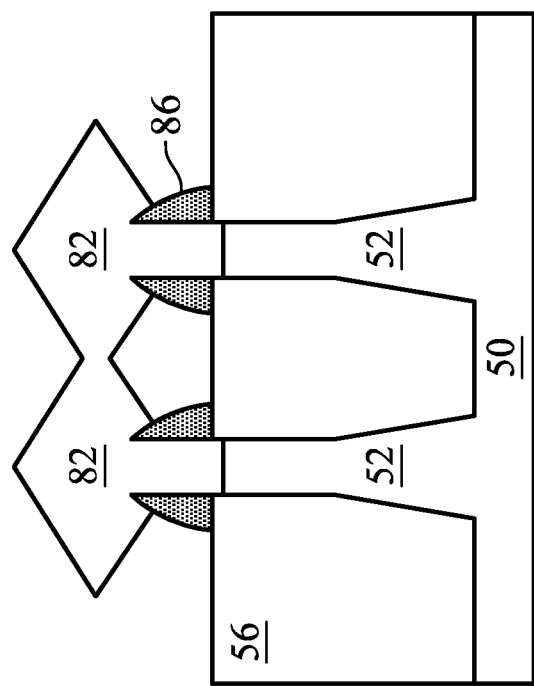

In FIGS. 23A and 23B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, silicon carbide, phosphorous doped silicon carbide, silicon phosphide, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as silicon-germanium, boron doped silicon-germanium, germanium, germanium tin, or the like. The epitaxial source/drain regions 82 in the region 50P may also have surfaces raised from respective surfaces of the fins 52 and may have facets.

The epitaxial source/drain regions 82 and/or the fins 52 may be implanted with dopants in a process similar to the process previously discussed for forming lightly-doped source/drain regions, followed by an anneal. The epitaxial source/drain regions 82 may have an impurity concentration of between about $10^{19}$ cm$^{-3}$ and about $10^{21}$ cm$^{-3}$. The n-type and/or p-type impurities for epitaxial source/drain regions 82 may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 23C. In other embodiments, adjacent source/drain regions 82 remain separated after the epitaxy process is completed as illustrated by FIG. 23D. In the embodiments illustrated in FIGS. 23C and 23D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 24B:
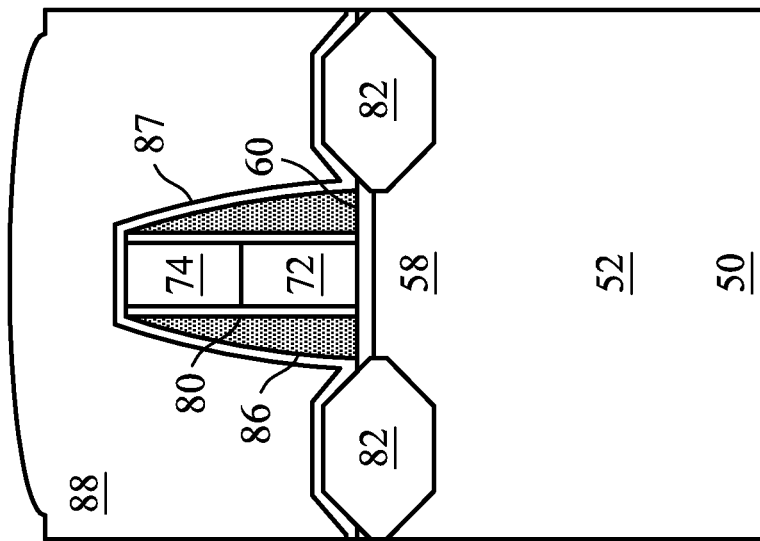
Figure 24A:
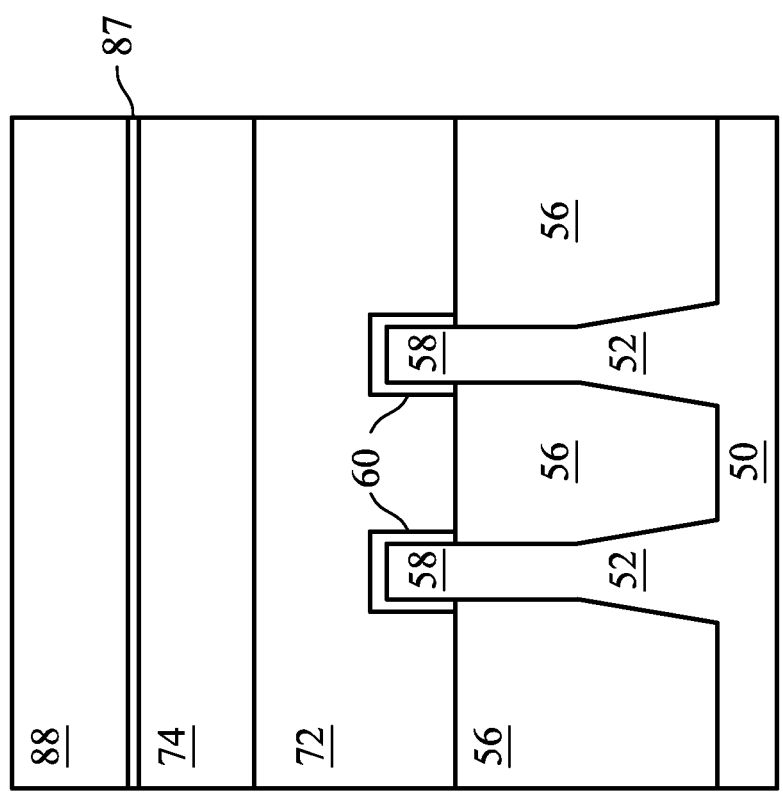

In FIGS. 24A and 24B, a first interlayer dielectric (ILD) 88 is deposited over the structure illustrated in FIGS. 23A and 23B. The first ILD 88 may be formed of a dielectric material, and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 25B:
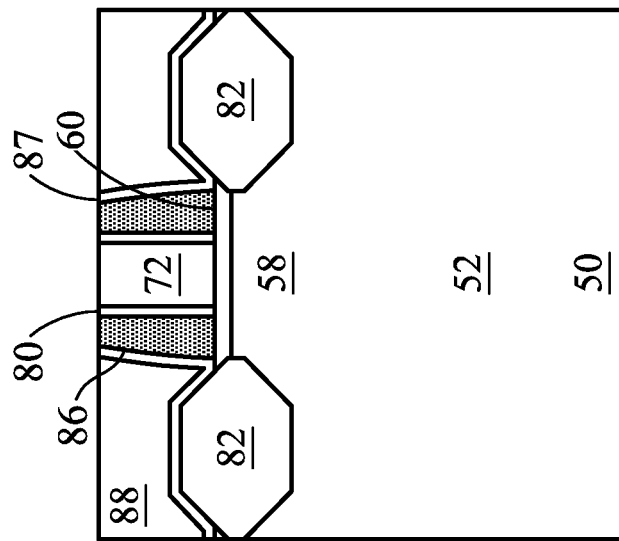
Figure 25A:
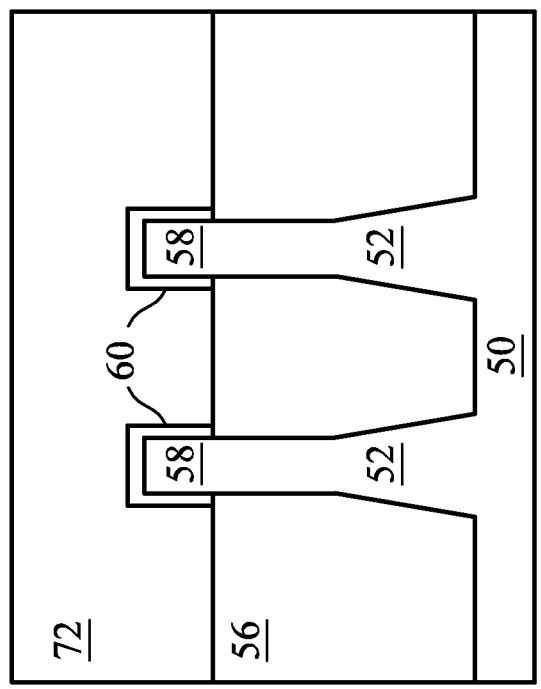

In FIGS. 25A and 25B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surface of the masks 74.

Figure 26B:
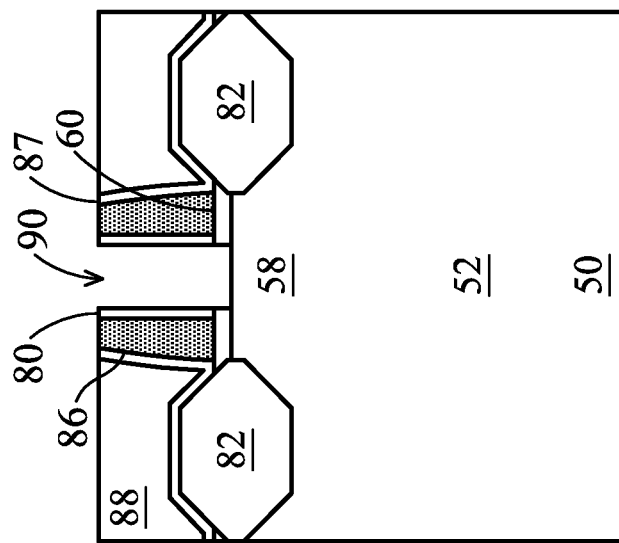
Figure 26A:
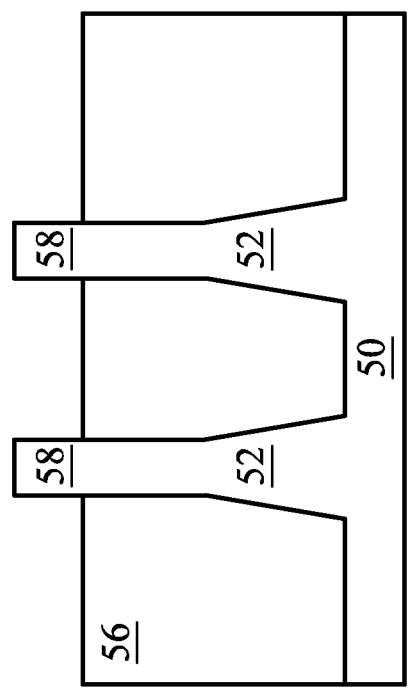

In FIGS. 26A and 26B, the dummy gates 72, and the masks 74 if present, are removed in an etching step(s), so that recesses 90 are formed. Portions of the first dummy dielectric layer 60 in the recesses 90 may also be removed. In some embodiments, only the dummy gates 72 are removed and the first dummy dielectric layer 60 remains and is exposed by the recesses 90. In some embodiments, the first dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the first dummy dielectric layer 60 may be used as an etch stop layer when the dummy gates 72 are etched. The first dummy dielectric layer 60 may then be optionally removed after the removal of the dummy gates 72.

Figure 27B:
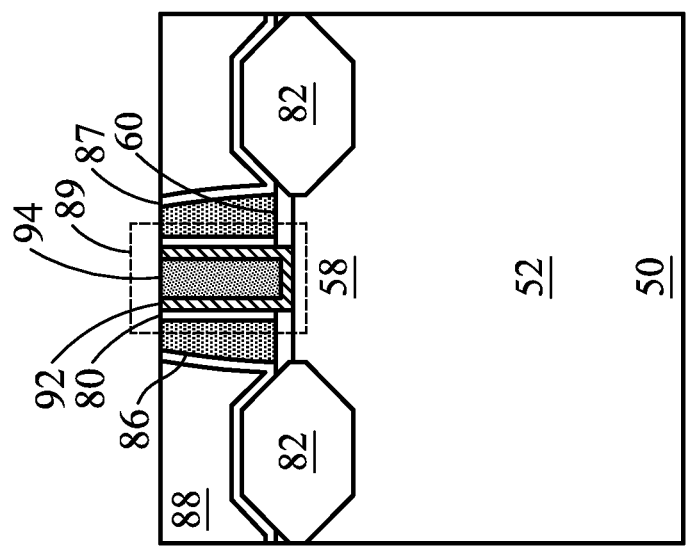
Figure 27A:
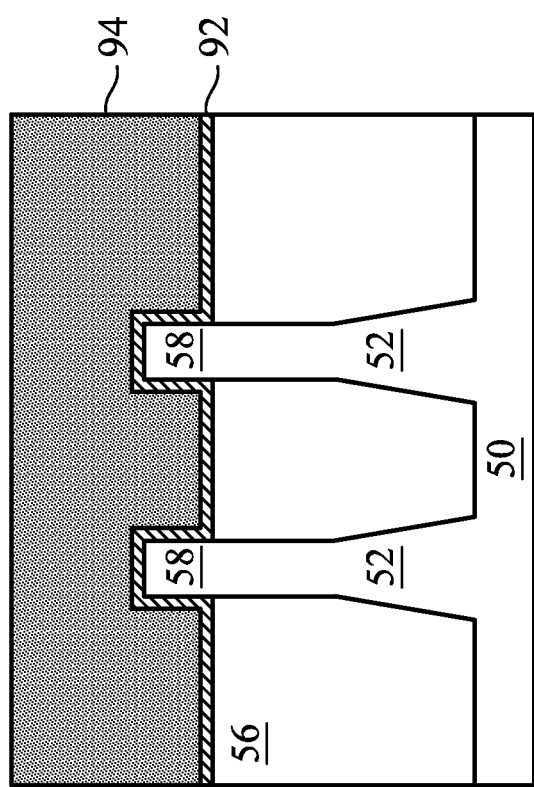
Figure 27C:
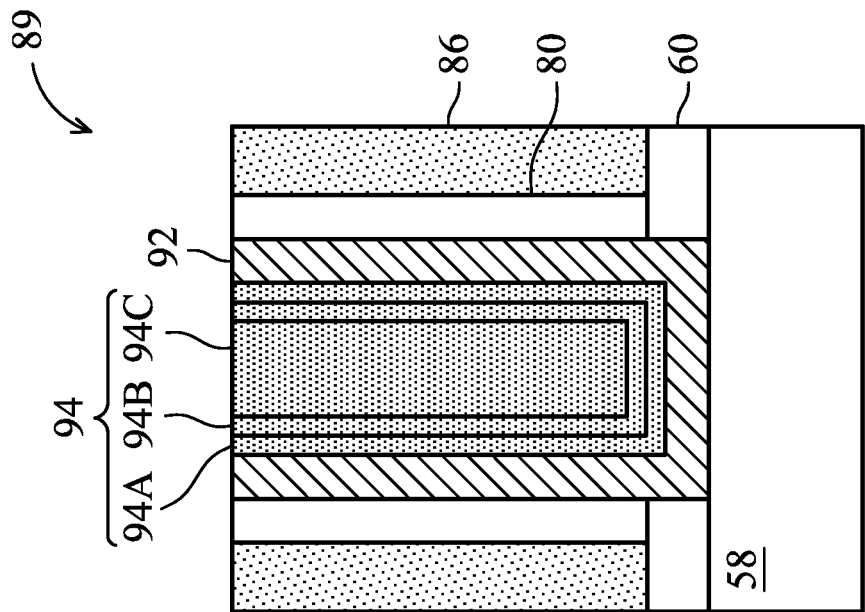

In FIGS. 27A and 27B, gate dielectric layers 92 and gate electrodes 94 are formed for replacement gates. FIG. 27C illustrates a detailed view of region 89 of FIG. 27B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include molecular-beam deposition (MBD), ALD, PECVD, and the like. In embodiments where portions of the first dummy dielectric layer 60 remains in the recesses 90, the gate dielectric layers 92 include a material of the first dummy dielectric layer 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 27B, the gate electrode 94 may comprise any number of liner layers 94A, any number of work function tuning layers 94B, and a fill material 94C as illustrated by FIG. 27C. After the filling of the recesses 90, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 28B:
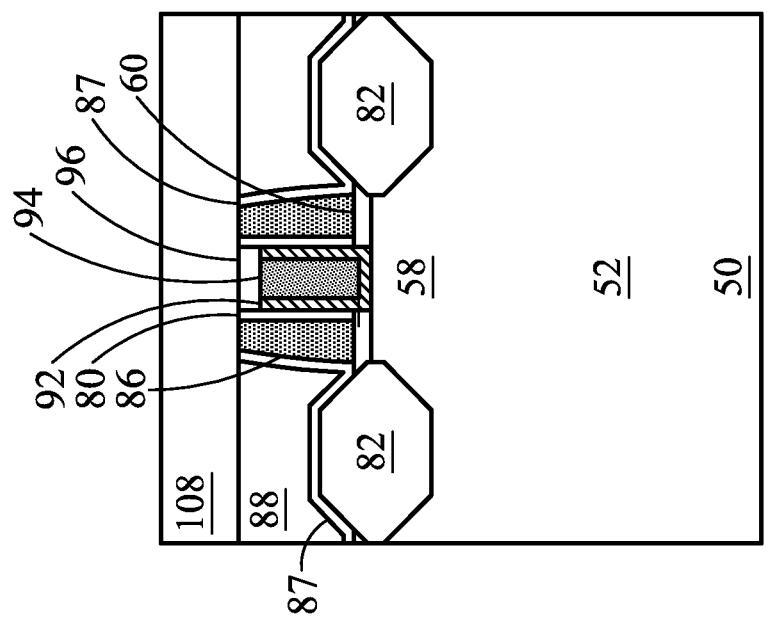
Figure 28A:
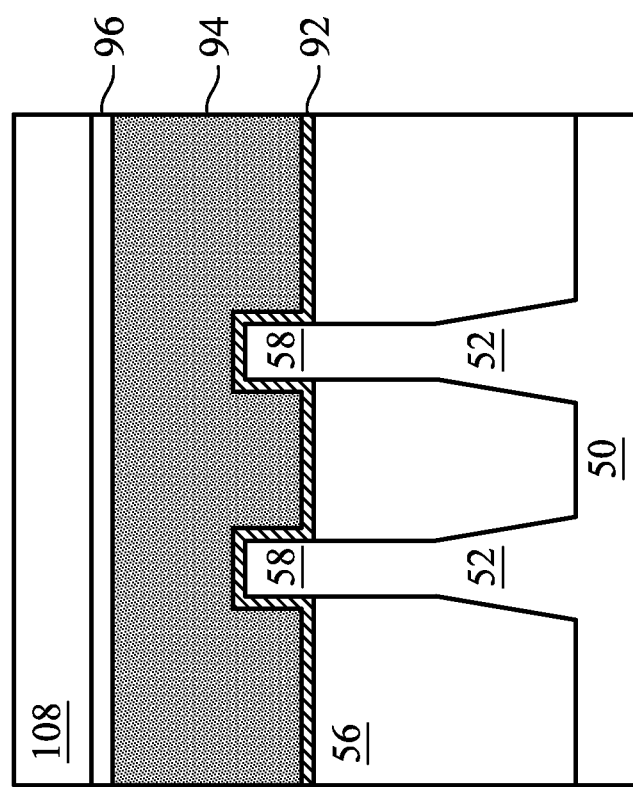

In FIGS. 28A and 28B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a gate dielectric layer 92 and a corresponding overlying gate electrode 94) is recessed, so that a recess is formed directly over the gate stack and between opposing portions of gate spacers 86, as illustrated in FIGS. 28A and 28B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (FIGS. 29A and 29B) penetrate through the gate mask 96 to contact the top surface of the recessed gate electrode 94.

Figure 29B:
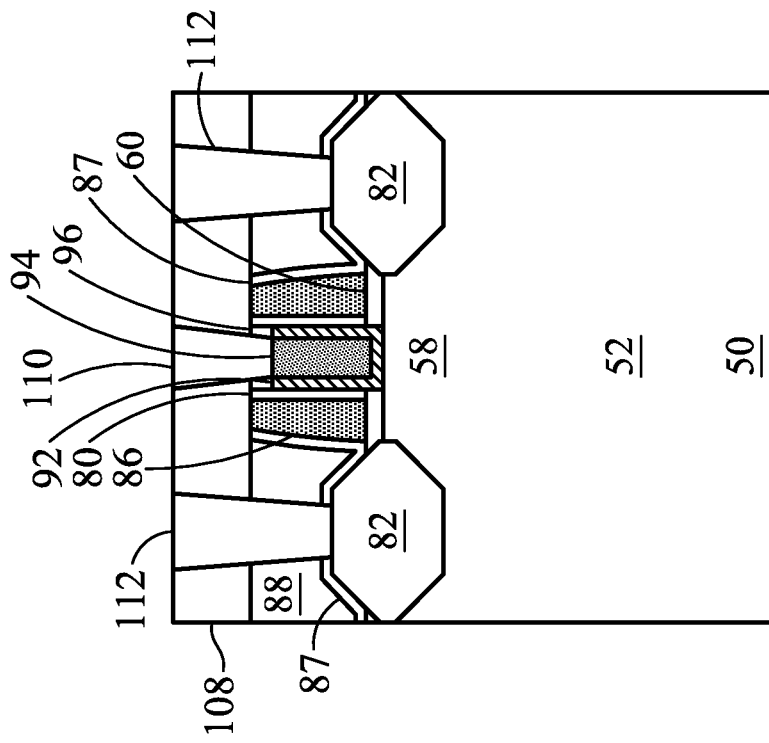
Figure 29A:
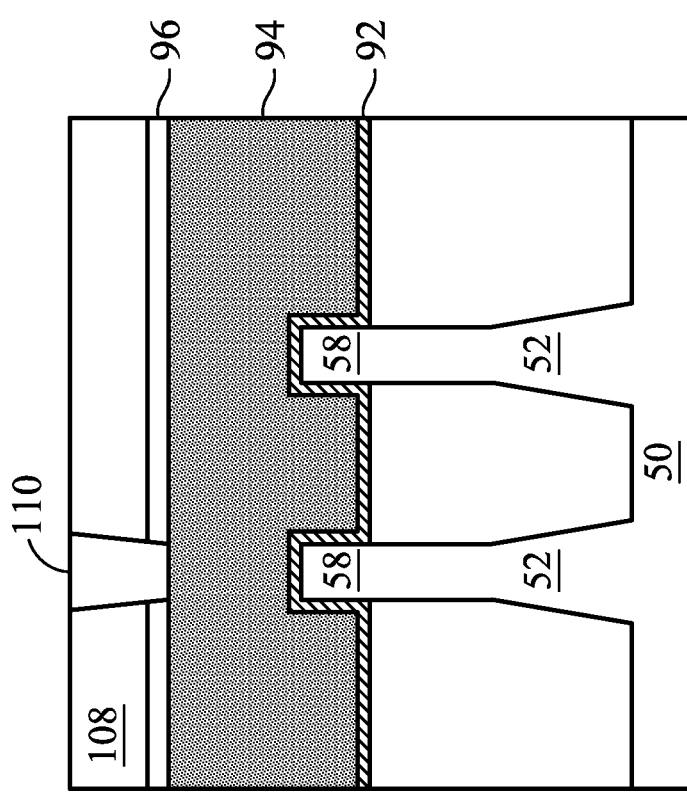

In FIGS. 29A and 29B, gate contacts 110 and source/drain contacts 112 are formed through the second ILD 108 and the first ILD 88 in accordance with some embodiments. Openings for the source/drain contacts 112 are formed through the first ILD 88 and the second ILD 108, and openings for the gate contact 110 are formed through the second ILD 108 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Using the CMP system 200, including the CDMs, allows ions to be prevented from being deposited on, or removed from surfaces of the substrate 50. This ensures that humps are not formed on the surface of the substrate 50 after the CMP process and as such, device performance and device yield are improved. Although the CMP system 200 has been described as being used for the CMP of the sacrificial layer 68 and the second dummy dielectric layer 66, the CMP system 200 or a similar CMP system including CDMs may be used for any CMP processes used to manufacture semiconductor devices, such as the CMP processes used to planarize the insulation material 54, the first ILD 88, the gate dielectric layers 92 and the gate electrodes 94, and/or the second ILD 108.

In accordance with an embodiment, an apparatus includes a planarization unit for planarizing a wafer; a cleaning unit for cleaning the wafer; a wafer transportation unit for transporting the wafer between the planarization unit and the cleaning unit; and a capacitive deionization module for removing ions from a solution used in at least one of the planarization unit or the cleaning unit. In an embodiment, the capacitive deionization module includes a first electrode and a second electrode, the first electrode and the second electrode being formed of a porous material. In an embodiment, the porous material includes porous carbon. In an embodiment, a major surface of the first electrode is separated from a major surface of the second electrode by a distance, and the solution flows between the first electrode and the second electrode in a direction parallel to the major surface of the first electrode and the major surface of the second electrode. In an embodiment, the first electrode is in contact with the second electrode, and the solution flows through the first electrode and the second electrode in a direction perpendicular to a major surface of the first electrode and a major surface of the second electrode. In an embodiment, the capacitive deionization module operates with a constant current of between 0 A and 30 A. In an embodiment, the capacitive deionization module operates with a constant voltage of between 0 V and 50 V.

In accordance with another embodiment, a method includes depositing a dummy gate layer on a wafer; depositing a dummy dielectric layer over the dummy gate layer; planarizing the dummy dielectric layer using a chemical mechanical planarization (CMP) process; performing a post-CMP cleaning process on the wafer; performing a drying process on the wafer; and removing ions from a CMP solution used in the CMP process, the post-CMP cleaning process, or the drying process using a capacitive deionization module. In an embodiment, the ions are removed from the CMP solution by applying a voltage between a first electrode and a second electrode in the capacitive deionization module. In an embodiment, the method further includes removing the ions from the capacitive deionization module by reversing or discontinuing the voltage applied between the first electrode and the second electrode. In an embodiment, the ions are removed from the CMP solution in an adsorption phase, the ions are removed from the capacitive deionization module in a desorption phase, and the method further includes monitoring electrical signals in the first electrode and the second electrode and switching between the adsorption phase and the desorption phase based on the electrical signals. In an embodiment, the ions are removed from the CMP solution prior to the CMP solution coming into contact with the wafer. In an embodiment, the ions are removed from a CMP slurry used to perform the CMP process. In an embodiment, the ions are removed from a cleaning solution used to perform the post-CMP cleaning process. In an embodiment, the ions are removed from a drying solution used to perform the drying process.

In accordance with yet another embodiment, an apparatus includes a planarization unit for planarizing a wafer, the planarization unit including a high-rate platen and a buffing platen; a cleaning unit for cleaning the wafer, the cleaning unit including a tank cleaning module, a chemical mechanical cleaning (CMC) module, a brush cleaning module, and a vapor dryer module; a wafer transportation unit for transporting the wafer between the planarization unit and the cleaning unit; and a capacitive deionization module (CDM) for removing ions from a solution used in the planarization unit or the cleaning unit. In an embodiment, the CDM is disposed in a main tank of the tank cleaning module. In an embodiment, the CDM removes ions from a CMP slurry used in the high-rate platen or the buffing platen. In an embodiment, the CDM removes ions from a cleaning solution used in the CMC module or the brush cleaning module. In an embodiment, the CDM removes ions from a drying solution used in the vapor dryer module.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a planarization device comprising a first platen and a first nozzle, the first nozzle being configured to flow a first solution onto the first platen;
   a cleaning device comprising a second nozzle and one or more wafer holders, the second nozzle being configured to flow a second solution; and
   a capacitive deionization device disposed on a surface of a polishing pad of the first platen, the capacitive deionization device being configured to remove ions from the first solution.

2. The apparatus of claim 1, wherein the capacitive deionization device comprises:
   a first electrode; and
   a second electrode separated by a distance from the first electrode, wherein the apparatus is configured to flow the first solution between the first electrode and the second electrode while removing ions from the first solution.

3. The apparatus of claim 2, wherein the capacitive deionization device further comprises:
   a first current connector coupled to the first electrode and configured to apply a first charge to the first electrode while removing ions from the first solution; and
   a second current connector coupled to the second electrode and configured to apply a second charge to the second electrode while removing ions from the first solution, the second charge being an opposite polarity than the first charge.

4. The apparatus of claim 2, wherein the first electrode and the second electrode each comprise a porous material.

5. The apparatus of claim 1, wherein the capacitive deionization device comprises:
   a first electrode; and
   a second electrode, wherein the apparatus is configured to flow the first solution through the first electrode and the second electrode while removing ions from the first solution.

6. The apparatus of claim 5, wherein the capacitive deionization device further comprises:
   a first current connector coupled to the first electrode and configured to apply a first charge to the first electrode while removing ions from the first solution; and
   a second current connector coupled to the second electrode and configured to apply a second charge to the second electrode while removing ions from the first solution, the second charge being an opposite polarity than the first charge.

7. The apparatus of claim 6, wherein the capacitive deionization device further comprises:
   an inlet on the first current connector, the inlet configured to input the first solution into the capacitive deionization device; and
   an outlet on the second current connector, the outlet configured to output the first solution from the capacitive deionization device.

8. The apparatus of claim 5, wherein the first electrode and the second electrode each comprise a porous material.

9. The apparatus of claim 5, wherein the capacitive deionization device further comprises a spacer between the first electrode and the second electrode, wherein the spacer comprises a porous material.

10. The apparatus of claim 1 further comprising:
    a second capacitive deionization device upstream of the second nozzle, the second capacitive deionization device configured to remove ions from a second solution.

11. The apparatus of claim 1, wherein the capacitive deionization device is configured to operate with a constant current of between 0 A and 30 A.

12. The apparatus of claim 1, wherein the capacitive deionization device is configured to operate with a constant voltage of between 0 V and 50 V.

13. An apparatus comprising:
    a planarization device comprising a high-rate platen and a buffing platen, the high-rate platen being configured to spin at a higher rate than the buffing platen;
    a first nozzle configured to flow a polishing solution over a polishing pad of the high-rate platen or the buffing platen; and
    a first capacitive deionization device (CDD) comprising a first electrode and a second electrode, wherein the first CDD is disposed on a surface of the polishing pad, and wherein the first CDD is configured to remove ions from the polishing solution.

14. The apparatus of claim 13, further comprising:
    a tank cleaning device comprising a main tank, an overflow tank, a first wafer holder, and a second CDD in the main tank, the second CDD is configured to remove ions from a first cleaning solution used in the tank cleaning device.

15. The apparatus of claim 13 further comprising:
    a chemical mechanical cleaning (CMC) device comprising a buff pad, a second nozzle, a second wafer holder, and a third CDD upstream from the second nozzle, the third CDD is configured to remove ions from a second cleaning solution used in the CMC device.

16. The apparatus of claim 13 further comprising:
    a brush cleaning device comprising a brush, a third nozzle, a third wafer holder, and a fourth CDD upstream from the third nozzle, the fourth CDD is configured to remove ions from a third cleaning solution used in the brush cleaning device.

17. The apparatus of claim 13 further comprising:
    a vapor dryer device comprising a fourth nozzle, a fourth wafer holder, and a fifth CDD upstream from the fourth nozzle, wherein the fifth CDD is configured to remove ions from a drying solution used in the vapor dryer device.

18. An apparatus comprising:
    a chemical mechanical planarization (CMP) device comprising a wafer carrier, a first nozzle, and a first polishing pad on a first platform;
    a cleaning device comprising a second nozzle;
    a drying device comprising a third nozzle; and
    a first capacitive deionization device disposed on the first polishing pad, the first capacitive deionization device configured to remove ions from a polishing solution; and
    a second capacitive deionization device disposed upstream of the first nozzle, the second nozzle, or the third nozzle.

19. The apparatus of claim 18, wherein the first capacitive deionization device comprises a first electrode and a second electrode spaced apart from the first electrode, wherein the polishing solution is configured to flow between the first electrode and the second electrode.

20. The apparatus of claim 18, wherein the first capacitive deionization device comprises a first electrode and a second electrode, wherein the polishing solution is configured to flow through the first electrode and the second electrode.

* * * * *